United States Patent [19]
Amemiya et al.

[11] Patent Number: 5,835,560
[45] Date of Patent: Nov. 10, 1998

[54] EXPOSURE APPARATUS

[75] Inventors: Mitsuaki Amemiya, Utsunomiya; Yutaka Watanabe, Takanezawamachi; Kazuyuki Kasumi, Utsunomiya, all of Japan

[73] Assignee: Canon Kabushiki Kaisha, Tokyo, Japan

[21] Appl. No.: 963,874

[22] Filed: Nov. 4, 1997

Related U.S. Application Data

[63] Continuation of Ser. No. 448,821, May 24, 1995, abandoned.

[30]     Foreign Application Priority Data

| May 24, 1994 | [JP] | Japan | 6-109696 |
| May 24, 1994 | [JP] | Japan | 6-109697 |
| May 24, 1994 | [JP] | Japan | 6-109698 |
| Feb. 14, 1995 | [JP] | Japan | 7-025276 |

[51] Int. Cl.⁶ ............................................. G21K 5/00
[52] U.S. Cl. ................................... 378/34; 378/150
[58] Field of Search ........................... 378/34, 84, 145, 378/146, 151, 150

[56]            References Cited

U.S. PATENT DOCUMENTS

| 5,123,036 | 6/1992 | Uno et al. |  |
| 5,125,014 | 6/1992 | Watanabe et al. |  |
| 5,157,700 | 10/1992 | Kurosawa et al. |  |
| 5,285,488 | 2/1994 | Watanabe et al. |  |
| 5,394,451 | 2/1995 | Miyake et al. | 378/34 |
| 5,444,758 | 8/1995 | Miyake et al. | 378/145 |
| 5,488,612 | 1/1996 | Kasumi et al. | 378/34 |

FOREIGN PATENT DOCUMENTS 2-100311   4/1990   Japan.

*Primary Examiner*—Don Wong
*Attorney, Agent, or Firm*—Fitzpatrick, Cella, Harper & Scinto

[57]               ABSTRACT

An exposure apparatus includes a mirror for reflecting radiation light from a light source, a driving mechanism for holding and oscillating the mirror, a detector for detecting the position of a beam of the radiation light projected on the mirror, an adjusting mechanism for adjusting the position of the mirror with respect to the radiation light on the basis of an output of the detector, and a reference table for positioning the driving mechanism and the detector with respect to the same reference.

12 Claims, 22 Drawing Sheets

$Pn = P(y', yn) \quad 1 \leq n \leq 6$ $Pn = P(y', yn + \triangle y) \quad 6 \geq n \geq 3$
$Pn = P(y', yn) \quad 1 \leq n < 3$ $Pn = Pn(y', yn + \triangle y + yo) \quad 6 \geq n \geq 3$
$Pn = Pn(y', yn) \quad 1 \leq n < 3$

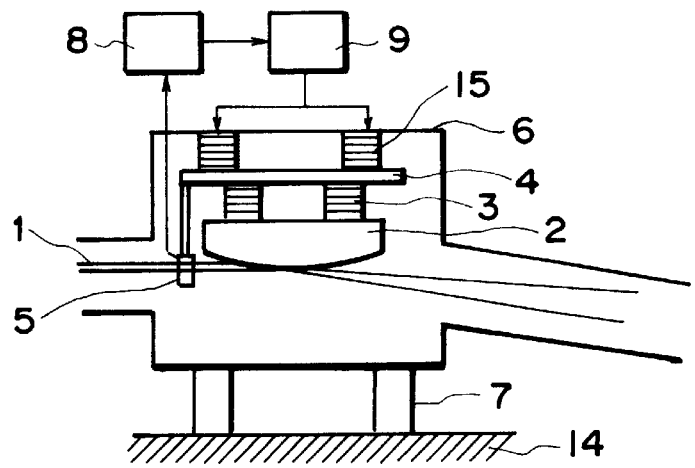
F I G. 6
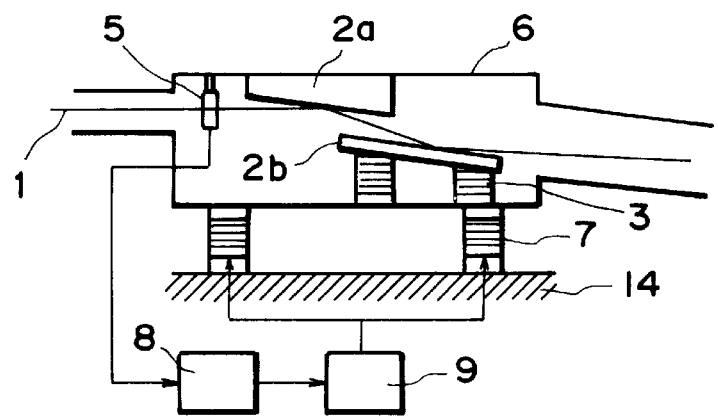
F I G. 7
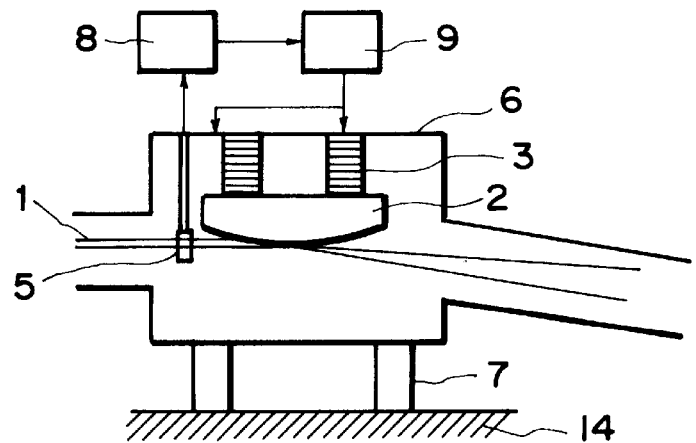
F I G. 8

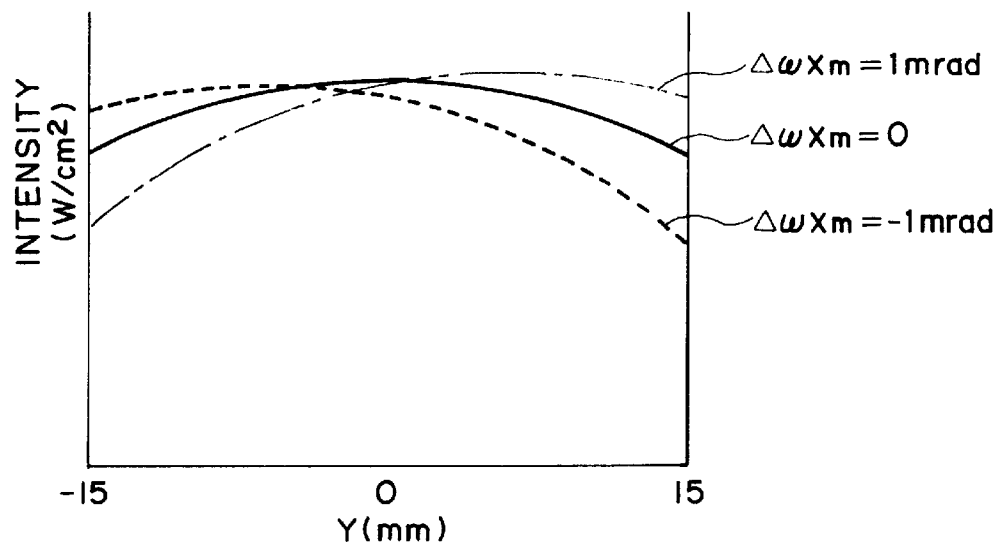
F I G. 21
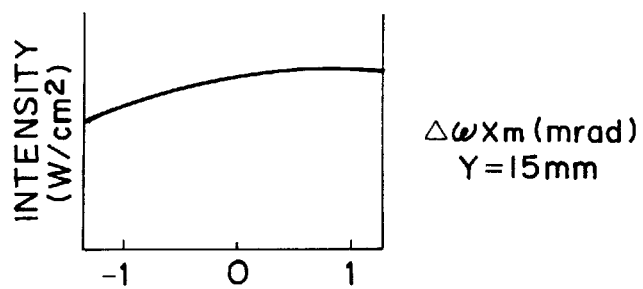
F I G. 22A
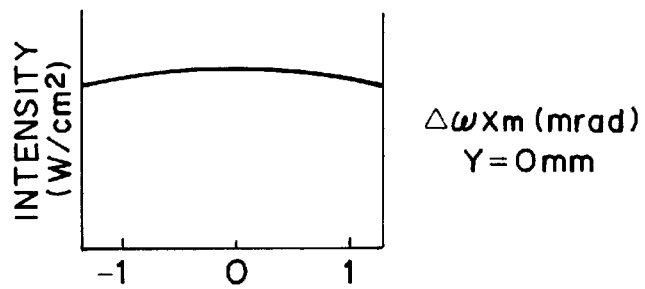
F I G. 22B
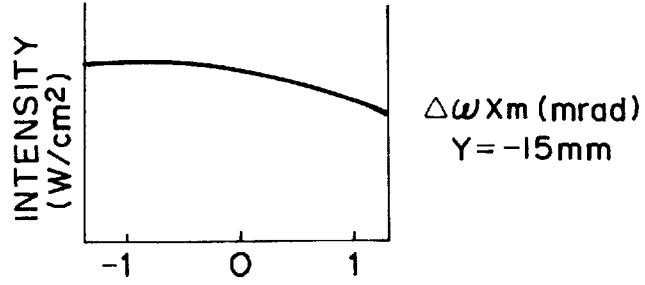
F I G. 22C

EXPOSURE APPARATUS

This application is a continuation of Application Ser. No. 08/448,821, filed May 24, 1995, now abandoned.

FIELD OF THE INVENTION AND RELATED ART

This invention relates generally to an exposure apparatus and, more particularly, to an exposure apparatus which uses synchrotron radiation light.

As an exposure method for the manufacture of a fine pattern such as a circuit pattern of a semiconductor device, an X-ray exposure method in which a pattern of a mask is transferred onto a resist coated wafer with synchrotron radiation light has attracted much notice. Synchrotron radiation light emitted by a synchrotron ring comprises a sheet-like beam having a thin thickness in the vertical direction. For example, it has a thickness of only about 5 mm in the vertical direction, even at a distance of 10 m from the point of emission. This is very small as compared with the size of a typical exposure region (25–30 mm). A method has therefore been proposed in which a beam of a sheet-like shape is reflected by an X-ray mirror which is oscillated (scanned) to scanningly displace the beam along the exposure region, to thereby substantively enlarge the range of illumination in the vertical direction.

If, however, there occurs a change in position of the beam incident on the mirror for some reason, the path of the reflected light changes. This adversely affects the exposure precision. In order to solve this problem, it is necessary to detect and correct a deviation in the relative position of the mirror and the beam inputted thereon. However, since the mirror is continuously oscillated, it is not easy to detect such relative positional deviation.

An exposure apparatus which uses synchrotron radiation light is disclosed in Japanese Laid-Open Patent Application, Laid-Open No. 100311/1990. Referring to FIG. 31 of the subject application, this apparatus will be explained.

This exposure apparatus is of a non-division exposure type wherein synchrotron radiation light (SR X-rays) from a synchrotron light source 1001 is projected on an X-ray mirror 1002 of cylindrical shape at a small angle and wherein X-rays diffused by the mirror 1002 are projected on a mask 102 and a wafer 103. Since the synchrotron radiation light has an intensity distribution of approximately Gaussian shape in a direction perpendicular to the electron orbit, in the illumination system of this apparatus, the synchrotron radiation has an X-ray intensity profile upon the exposure region such as illustrated in FIG. 32. The illuminance changes largely between a central portion of the exposure region and a peripheral portion thereof. The exposure process is formed while correcting such non-uniformness of luminance by means of a shutter unit 103, whereby uniform exposure over the whole exposure region is assured FIG. 33 shows the shutter mechanism. A steel belt 1010 extending around a driving drum 1009 and an idler drum 1011 has formed therein an oblong aperture 1012 having a leading edge 1004 and a trailing edge 1005. Axis y corresponds to a direction (substantially vertical direction) perpendicular to the optical axis of the synchrotron radiation light. Axis t represents time. A curved line 1006 depicts the locus (trace) of the leading edge 1004, and a curved line 1007 depicts the locus (trace) of the trailing edge 1005. In this shutter mechanism, the driving drum 1009 is so actuated that different exposure times Δt(y) are provided at different points along the y-axis in accordance with the illuminance profile of FIG. 32. This assures a constant exposure amount (="exposure time"×"illuminance") over the whole exposure region 1008.

In this arrangement, however, since the position of the synchrotron radiation light projected on the mask (wafer) surface exactly corresponds to the position on the mirror reflection surface, an error in shape or unevenness of reflectivity of the mirror reflection surface causes unwanted non-uniformness in illuminance of the synchrotron radiation light projected to the mask surface, that is, local deformation of the Gaussian intensity distribution of the synchrotron radiation light. It is, therefore, required to maintain a very high precision with respect to the machining of the mirror, in order to keep the non-uniformness of illuminance very small. This necessitates a high cost.

Furthermore, even if a reflection mirror that is used has an idealistic surface shape and a uniform reflectivity, there is a possibility that a non-uniform intensity profile is produced due to factors other than the mirror. For example, it may be produced when a transmission window (Be window) through which SR X-rays go out of a vacuum has a non-uniform X-ray transmissivity or when an X-ray transmission film of a mask has a non-uniform transmissivity. Also, it may be produced when a resist applied to a wafer has a non-uniform sensitivity.

SUMMARY OF THE INVENTION

It is accordingly an object of the present invention to provide an exposure apparatus by which at least one of the problems described hereinbefore is solved.

It is another object of the present invention to provide a device manufacturing method which uses such an exposure apparatus.

It is a further object of the present invention to provide an exposure apparatus or an exposure method in which the relative position of an oscillation mirror and a beam projected thereon is detected Precisely and, on the basis of the detection, high exposure precision is assured.

It is a still further object of the present invention to provide an exposure apparatus or an exposure method by which non-uniformness of illuminance attributable to a mirror is reduced in a simple manner to assure improved exposure precision and/or reduction in required precision for the mirror.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 6 is a schematic view of an exposure apparatus according to a second embodiment of the present invention.

FIG. 7 is a schematic view of an exposure apparatus according to a third embodiment of the present invention.

FIG. 8 is a schematic view of an exposure apparatus according to a fourth embodiment of the present invention.

FIG. 21 is a schematic view of an intensity profile of synchrotron radiation light impinging on a mask as provided when a mirror is rotationally moved.

FIGS. 22A, 22B and 22C are schematic views for explaining the relation between the rotational angle of a mirror and an intensity of synchrotron radiation light impinging on a mask.

DESCRIPTION OF THE PREFERRED EMBODIMENTS

Preferred embodiments of the present invention will be explained below, in conjunction with the drawings. In the description to be made below, the words "chief ray" will be used to refer to such light of the synchrotron radiation light impinging on a mirror that advances parallel to the electron orbit of a synchrotron ring and that is incident on the center of the mirror reflection surface in a direction parallel to the electron orbit. Also, the words "intensity profile" will be used to refer to a profile which is based on the absorption sensitivity of a photosensitive material applied to a wafer.

Further, while some examples will be described below in conjunction with an exposure apparatus which uses synchrotron radiation light, the invention is not limited to this form. The invention is also applicable to an exposure apparatus which uses a laser plasma X-ray source or any other radiation source.

Embodiment 1

Figure 1:
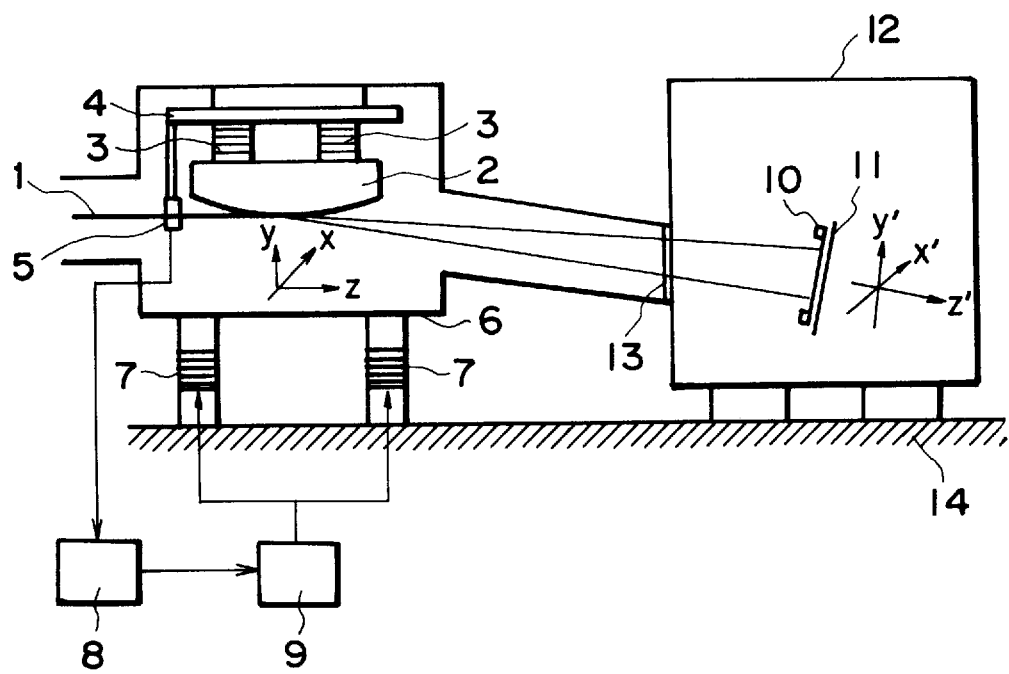
FIG. 1 is a schematic view of an exposure apparatus according to a first embodiment of the present invention.

FIG. 1 shows a first embodiment of the present invention. Denoted at 1 is synchrotron radiation light (a sheet beam) which is guided through a beam port. Denoted at 2 is a mirror for reflecting the guided light. Mirror 2 has a curved surface of convex shape, but it may comprise a flat mirror. Denoted at 3 is a mirror driving mechanism for oscillating (scanningly moving) the mirror 2 so as to expand the sheet-like radiation lights The mirror driving mechanism comprises a piezoelectric device mechanism or a linear motor mechanism. Denoted at 4 is a reference table for holding the mirror driving mechanism. Denoted at 5 is an X-ray position detector for detecting the beam position of the synchrotron radiation light, and it is mounted on the reference table 4, too. Thus, the mirror driving mechanism 3 and the X-ray position detector 5 are made into a substantially integral structure, so that no relative displacement occurs between them. As regards the mirror 2 and the X-ray position detector 5, the relative position of them is changeable by means of the mirror driving mechanism 3. Denoted at 6 is a mirror chamber for accommodating the mirror 2, the X-ray position detector 5 and the reference table 4 therein. An ultra high vacuum is maintained inside the mirror chamber 6. Denoted at 7 is a mirror chamber holding mechanism which has a driving mechanism for adjusting the position and attitude of the mirror chamber 6 with respect to a floor 14. Denoted at 8 is a computing device for processing output signals from the X-ray position detector 5 and for calculating the position of incident radiation light. Denoted at 9 is a control device for actuating the mirror chamber holding mechanism 7 in response to a signal from the computing device 8.

Denoted at 10 is an X-ray mask, and denoted at 11 is a water. The mask 10 and the wafer 11 are held close to each other, within an exposure chamber 12 which is filled with a gas having a high X-ray transmissivity such as He gas, for example. Denoted at 13 is an X-ray window which is made of Be, for example, for isolating the ultra high vacuum at the mirror chamber side and the He ambience at the exposure chamber side from each other.

Figure 2:
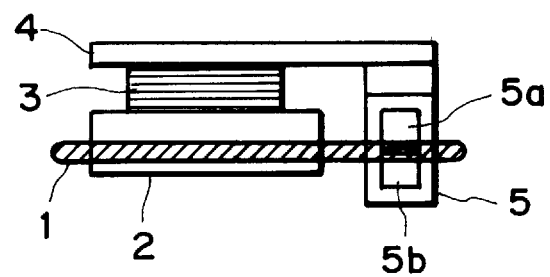
FIG. 2 is a side view of the apparatus of FIG. 1.

FIG. 2 illustrates the exposure apparatus of FIG. 1 as viewed from the radiation light input side. The X-ray position detector 5 is placed along side the mirror 2 so that it does not interfere with the radiation light 1 projected to the mirror 2. The X-ray position detector 5 comprises bisected light receiving elements: two, upper and lower light receiving elements 5a and 5b are disposed in a vertical direction.

With the arrangement described above, the mirror driving mechanism 3 operates to oscillate the mirror 2 vertically so that the beam reflected by the mirror 2 scans the mask 10 surface along the vertical direction. Here, if an actual position of the mirror 2 is denoted by y, the moving speed at that moment is denoted by v(y), and the X-ray irradiation intensity at a position y' upon the mask 10 at the moment whereat the mirror 2 is at the actual position y is denoted by P(y', y), then the exposure amount D(y') at the position y' is expressed as follows:

$$D(y')=\int P(y',y)/v(y)dy.$$

It follows that a uniform exposure amount over the whole exposure region is assured it the mirror moving speed v(y) is determined to maintain the exposure amount D(y',) constant independently of the position y'.

Figure 3:
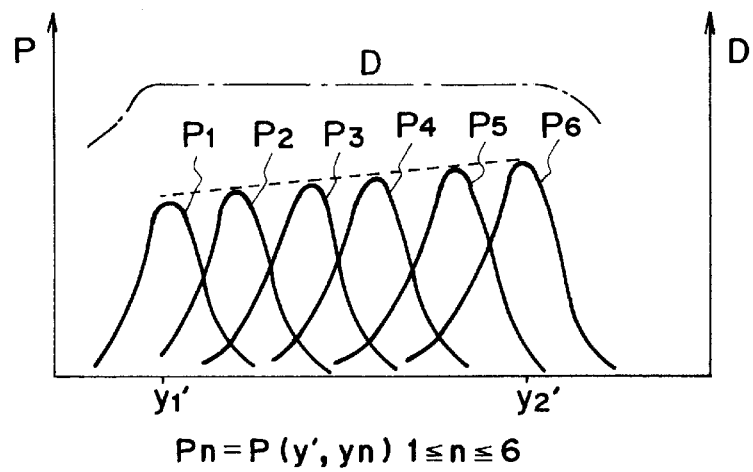
FIG. 3 is a graph for explaining irradiation intensity distribution and exposure amount in an exposure region.

FIG. 3 illustrates the displacement of the intensity distribution of a beam projected on the mask 10 surface with the upward and downward motion of the mirror 2. Intensity distribution $P_n$ in the drawing corresponds to $P(y', Y_n)$ and depicts the intensity distribution when the mirror 2 is at an actual position $y_n$. It is seen from this drawing that, with the displacement of the actual position of the mirror 2, the X-ray beam impinging on the mask surface displaces while its intensity is changed.

When the actual position of the mirror 2 is nearer to $y_1$, (downward in the vertical direction in FIG. 1), the glancing angle (the angle defined between the radiation light 1 and the entrance surface of the mirror 2) is larger, such that the reflectivity is smaller and the intensity of the projected light on the mask is smaller, To the contrary, when the actual position of the mirror 2 is nearer to $y_6$ (upward in the vertical direction in FIG. 1), the glancing angle is smaller such that the reflectivity is larger and the intensity of projected light upon the mask is larger. Therefore, as will be understood from the above equation, the mirror moving speed v(y) may be made lower as the mirror actual position y is smaller, while the mirror moving speed v(y) may be made higher as the mirror actual position y is larger. This assures a uniform exposure amount over the whole mask surface, independently of the position y'. When the exposure region ranges from $y'_1$ to $Y'_2$, a dash-and-dot line D in FIG. 3 depicts the exposure amount D which is so made uniform within this range. Also, an envelope of intensity distribution is depicted by a broken line in the drawing, which is a smooth curve having no discontinuity.

Figure 4:
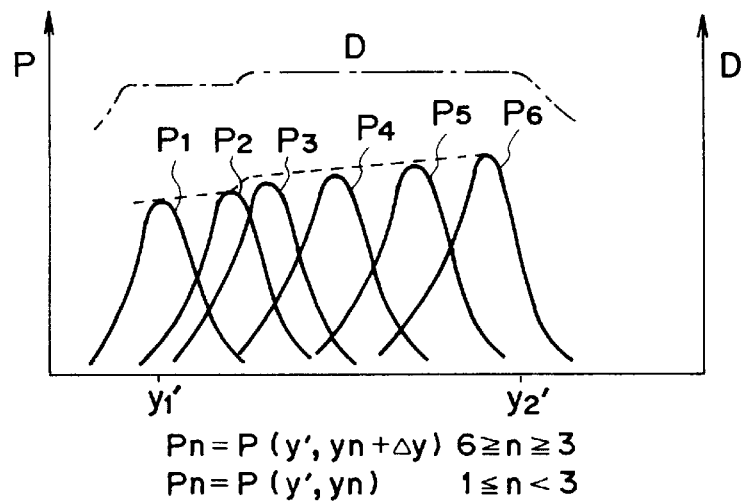
FIG. 4 is a graph similar to FIG. 3, for explaining another example of irradiation intensity distribution and exposure amount in an exposure region.

However, if for any reason the average position of the mirror 2 changes by Δy during the exposure process, a step would appear in the envelope. FIG. 4 shows an example wherein the position of the radiation light changes upwardly along the vertical direction, that is, a case where the mirror average position which is at $y_3$ changes to $y_3+\Delta y$. As compared with the original (unchanged) intensity distribution $P(y', y_3)$, the changed intensity distribution $P(y', y_3+\Delta y)$ is in the following relation:

$$P(y', y_3)<P(y', y_3+\Delta y)$$

If, therefore, the mirror 2 is moved at a speed V(y) having been determined in the manner described hereinbefore, the exposure amount D upon the mask surface becomes non-uniform as depicted by a broken line in FIG. 4.

Figure 5:
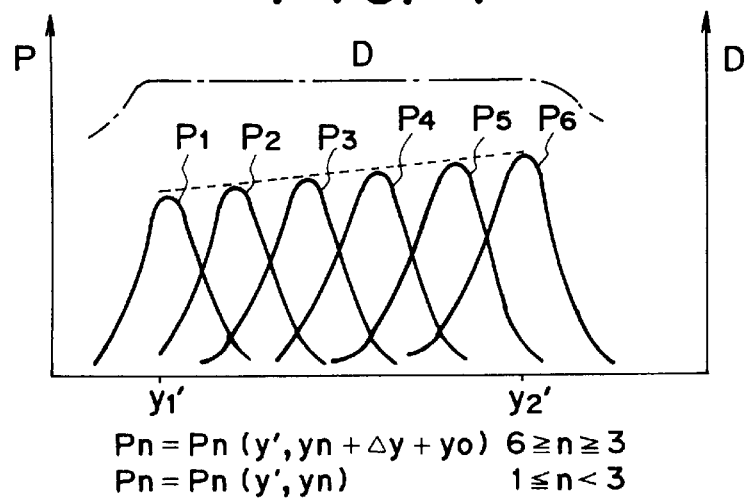
FIG. 5 is a graph similar to FIG. 3, for explaining a further example of irradiation intensity distribution and exposure amount in an exposure region.

In order to avoid this problem, in this embodiment, the X-ray position detector 5 is used to continuously monitor an average relative positional relationship between the radiation light 1 and the mirror 2 reflection surface, or the average position of the mirror 2. More specifically, when the outputs of the two light receiving elements 5a and 5b of the X-ray position detector 5 are denoted by Ia and Ib, the computing device 8 operates to calculate I:

$$I=(Ia-Ib)/(Ia+Ib),$$

and any change in the average position of the mirror 2 is determined from a change in I. If a change in the average position of the mirror 2 is detected by the computing device 8, the control device 9 operates in response thereto to actuate the chamber holding mechanism 7 to move (correct) the mirror chamber by $\Delta y_0$ which corresponds to the amount of change. If this is done, the intensity distribution becomes $P(y', y_3+\Delta y+\Delta y_0)$. Therefore, by driving the mirror chamber 6 so as to provide $\Delta y_0=-\Delta y$, the exposure amount D can be made uniform, independently of the position y' on the mask surface. FIG. 5 illustrates the result obtained by such correction.

Embodiment 2

FIG. 6 is a schematic view of the structure of a second embodiment of the present invention. Like numerals as those of FIG. 1 are assigned to corresponding elements. This embodiment includes adjusting means for adjusting the relative position of a mirror 2 with respect to synchrotron radiation light 1, which means comprises a driving mechanism 15 disposed within a mirror chamber 6, for supporting a reference table 4. The driving means 15 operates in response to a detection output of a detector 5 to displace the reference table 4. As compared with the preceding embodiment, a mirror chamber holding mechanism 7 is not provided with such a driving mechanism, and the mirror chamber is held stationary with respect to a floor 14 continuously.

Embodiment 3

FIG. 7 is a schematic view of the structure of a third embodiment of the present invention. This embodiment uses a two-mirror system for scanning synchrotron radiation light. First mirror 2a has a toroidal shape, for converging X-rays in a horizontal direction, and a second mirror 2b oscillates to expand the region.

Computing device 8 serves to measure the average position of radiation light projected on the first mirror 2a, on the basis of the detection by an X-ray position detector 5. If the average position changes by Δy, a chamber holding mechanism 7 is so actuated to apply an offset, of an amount corresponding to Δy, to the mirror oscillation control through a driving device 9, such that the average position of the mirror relative to the radiation light projected thereto can be maintained constant.

It is to be noted that it is not always necessary to perform the position measurement to the radiation light, at a position before the first mirror 2a. It may be performed at a position between the first and second mirrors 2a and 2b. Alternatively, the position measurement may be performed both to the light going to impinge on the first mirror and to the light going to impinge on the second mirror.

Embodiment 4

FIG. 8 is a schematic view of the structure of a fourth embodiment of the present invention. This embodiment has a feature that a mirror driving device for oscillating a mirror 2 functions also to correct the average position of the mirror 2. Although this embodiment is not provided with a reference table such as that of the preceding embodiments, an X-ray position detector 5 and the mirror driving mechanism 3 are both fixedly mounted in a mirror chamber 6 so that they are made substantially integral with each other.

The following explanation will be made with an assumption that an absolute position of radiation light 1 with reference to the chamber (and thus, a floor 14) is denoted by $y_s$, an absolute position of the mirror 2 is denoted by y", and the driving speed of the mirror 2 is the function of the absolute position y", that is, V(y").

If, during the exposure process the position of the radiation light as measured as $y_s$ through the X-ray position detector 5 changes and, at time t, it is detected as having been changed to $y_s+\Delta y$, this means that the average position of the mirror 2 (relative position of the mirror and the radiation light) has changed to $y-\Delta y$. Without correction or compensation, non-uniform exposure results as having been described with reference to FIG. 4. Therefore, the absolute position of the mirror 2 is changed promptly by $\Delta y_0$. With this correction of $\Delta y_0=\Delta y$, the mirror average position can be maintained constant.

Viewing this from the mirror driving device 3 side, it is equivalent to that: the mirror 2 which has been driven about a center (absolute position $y''_1$) and at a speed $V(y'')$, is driven, after the change at time t, about an absolute position $y''+\Delta y$ and at a speed $V(y''+\oplus y)$ with the addition of an offset.

In the embodiments described above, a convex mirror is oscillated translationally along a vertical direction. However, the invention is applicable also to other mirror oscillation types wherein a concave mirror or a convex mirror is rotationally oscillated, or wherein a flat mirror is oscillated vertically or rotationally. Further, the invention is applicable to a case wherein a mirror is oscillated vibratorily so as to reduce non-uniformness of exposure attributable to a small shape error or a scratch on the mirror surface.

As a mechanism for rotationally oscillating the mirror, there may be a structure for applying rotational oscillation about an axis by means of a motor or a piezoelectric device, a structure wherein a mirror is supported by a plurality of linear actuators and wherein rotational motion is applied by shifting the drive phases of these actuators.

Embodiment 5

Figure 9:
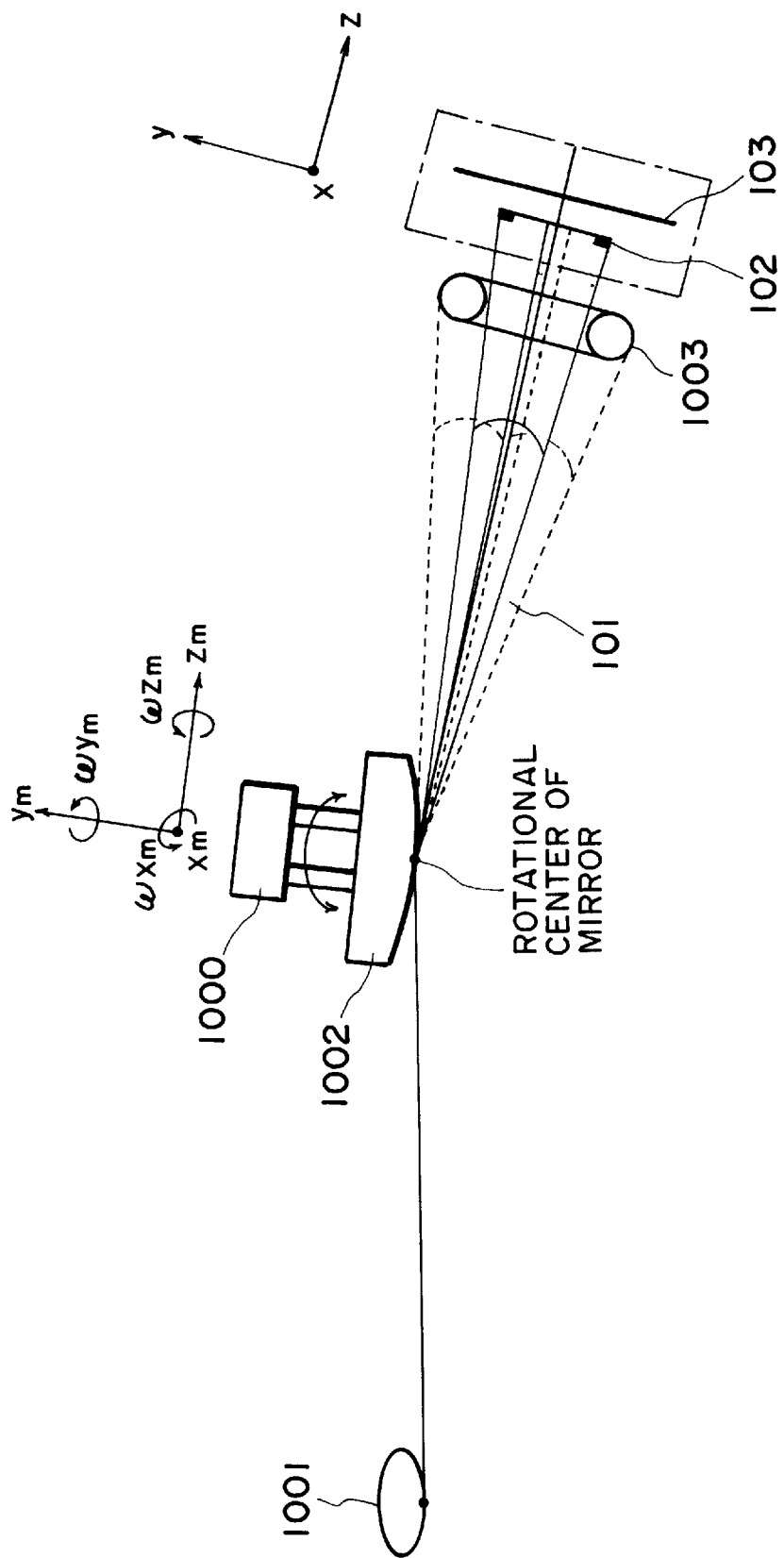
FIG. 9 is a schematic view of an exposure apparatus according to a fifth embodiment of the present invention.

FIG. 9 is a schematic view of the structure of an exposure apparatus according to a fifth embodiment of the present invention.

Denoted at 1001 is a synchrotron ring (light source), and denoted at 1002 is a cylindrical mirror. The mirror is oscillated in a $wx_m$ direction vibratorily and quickly by means of an oscillation mechanism 1000. Denoted at 1003 is a shutter mechanism for exposure amount correction, for making spatially uniform the exposure strength. Denoted at 101 is reflected light of SR X-rays, being reflected by the mirror 1002. The light 101 serves as illumination light for transferring a pattern formed on a mask 102 onto a wafer 103.

Here, the optical axis of the SR X-rays being projected on the mirror 1002, being parallel to the electron orbit of the synchrotron ring 1001 and being incident at the center of the mirror reflection surface with respect to a direction parallel to the electron orbit, is defined as the chief ray. Also, the words "intensity profile" to be used below refer to the intensity profile as determined in terms of the absorption sensitivity of a photosensitive material applied to a water 103.

Figure 33:
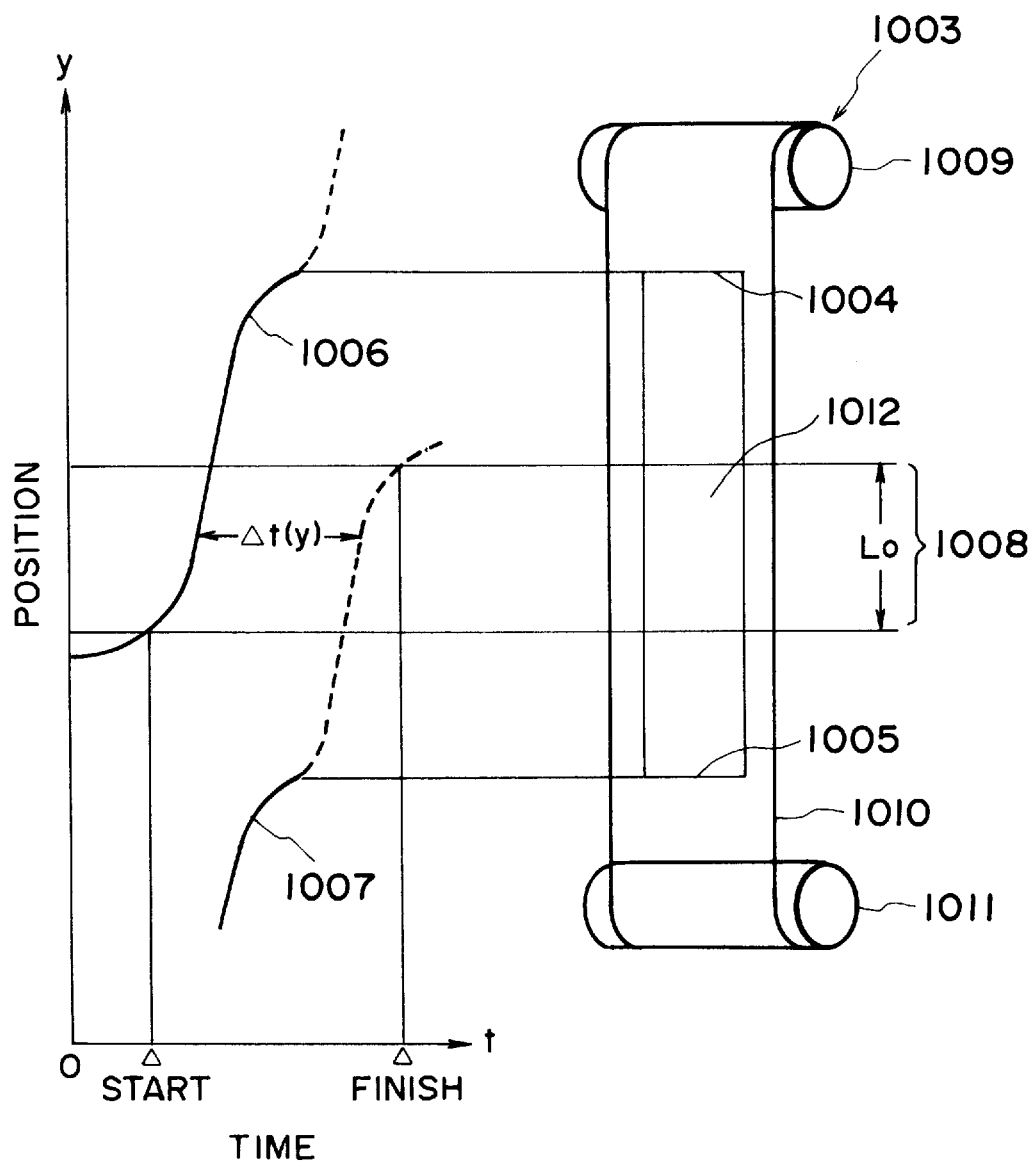
FIG. 33 is a schematic view of a shutter mechanism.

The SR X-rays emitted by the synchrotron ring 1001 are expanded by the mirror 1002 in a direction perpendicular to the electron orbit plane of the synchrotron ring to a size sufficient for irradiation of the whole view angle. The mirror 1002 is reciprocated rotationally through a small rotational angle at a high speed by the oscillation mechanism 1000, about the center of the mirror reflection surface and around an axis which is parallel to the electron orbit plane of the synchrotron ring and which is perpendicular to the direction of emission of the SR X-rays. This causes minute upward and downward displacement of the intensity profile of the projected SR X-rays within the exposure view angle. On the basis of the average intensity profile at that time, the shutter mechanism 1003 is actuated to perform uniform exposure over the whole view angle. While the shutter mechanism 1003 has a similar structure as has been described with reference to FIG. 33, drive thereof is controlled in accordance with a drive curve different from that of the FIG. 33 example. Details of this will be described later.

Next, the manner of oscillating the mirror 1002 will now be explained.

Figure 10:
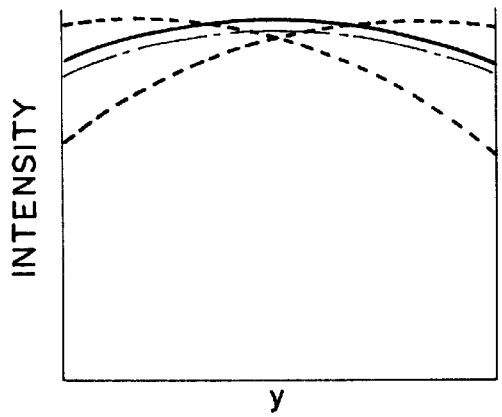
FIG. 10 is a schematic view for explaining an intensity profile of SR X-rays impinging on a mask as provided when an idealistic mirror is oscillated.

First, a case where the mirror 1002 has an idealistic shape (cylindrical) and has no error in shape and no unevenness in reflectivity will be considered. The intensity profile of the SR X-rays projected to the mask surface in such a case is depicted in FIG. 10. The axis of the abscissa of the graph represents the y direction in the exposure view angle. Since the SR X-rays have no intensity distribution in the x direction, only the y axis is depicted in the drawing. A solid line in the drawing depicts the intensity profile when the mirror 1002 is at the center of the oscillation stroke of the rotational oscillation, and two broken lines depict the intensity profiles when the mirror 1002 is at the end positions of this stroke, respectively. The dash-and-dot line depicts the average intensity of the SR X-rays projected onto the mask surface as the mirror 1002 reciprocates.

Here, if the mirror 1002 rotates in the $wx_m$ direction, the SR X-ray beam projected to the mask displaces in the y direction with this rotation, while the intensity profile shape thereof does not vary largely. Namely, with the rotational oscillation of the mirror 1002, the intensity profile upon the mask reciprocates in the y direction without substantial change. Also, if the rotational angle of the mirror 1002 is small, the average intensity profile has substantially the same shape as that of the intensity profile provided when the mirror 1002 is held fixed at the center of the oscillation stroke, and the intensity as a whole becomes smaller.

Next, a case where a cylindrical mirror has an error in shape or unevenness in reflectivity such that the SR X-ray beam reflectively expanded by the mirror 1002 has a non-uniform intensity, that is, a practical case, will be explained. The incidence angle of the SR X-ray beam projected on the mirror 1002 is set small (about 10 mrad) so as to enable use of the whole reflection region of X-rays. As a result of this, any non-uniformness in the SR X-rays reflected by the mirror 1002 attributable to an error in shape or unevenness of reflectivity is reproduced on the mask surface while being compressed along the y direction. Namely, even if the error in shape or unevenness of reflectivity of the reflection surface of the mirror 1002 has a large periodicity, the reproduced periodicity on the irradiated mask surface becomes small.

Figure 11A:
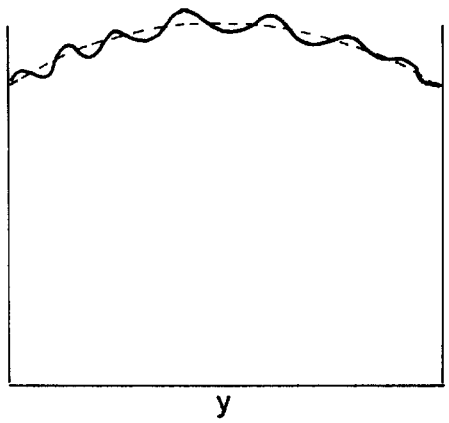
FIGS. 11A and 11B are schematic views for explaining an intensity profile of SR X-rays impinging on a mask as provided when an actual mirror is oscillated.

FIG. 11A shows an example of an intensity profile of SR X-rays projected on the mask surface as provided as a result of projection of SR X-rays upon a mirror having an error in shape thereof. The axis of the abscissa corresponds to the y-axis position on the mask surface, and the axis of the ordinate corresponds to the intensity. If a mirror has an idealistic shape (with no error in shape) and has no unevenness of reflectivity, there is no intensity distribution produced with respect to the x-axis position such that the intensity is uniform in this direction. Practically, however, a mirror has an error in shape and/or unevenness of reflectivity which has a distribution in the position on the mirror reflection surface ($X_m$ direction in FIG. 9). As a result, the intensity profile of the SR X-ray beam projected on the mask surface has a distribution with respect to the x direction. The intensity profile shown in FIG. 11 is a representative one at a certain x position upon the mask surface.

A solid line in the graph depicts an actual profile, and a broken line depicts an average intensity provided by oscillating the mirror. It is seen from this graph that the actual profile has a shape which corresponds to a shape to be provided by combining a Gaussian distribution shape (which the SR X-rays originally possess) with the error in shape of and unevenness of reflectivity of the mirror.

Figure 11B:
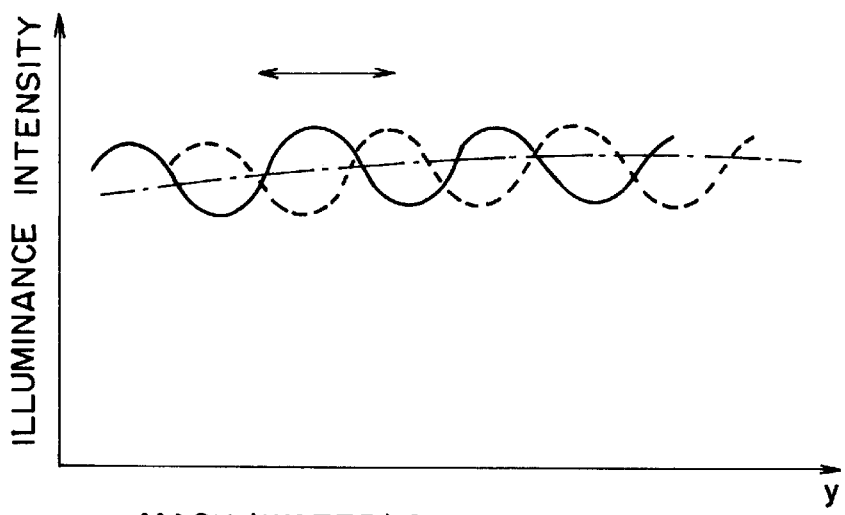
Figure 14:
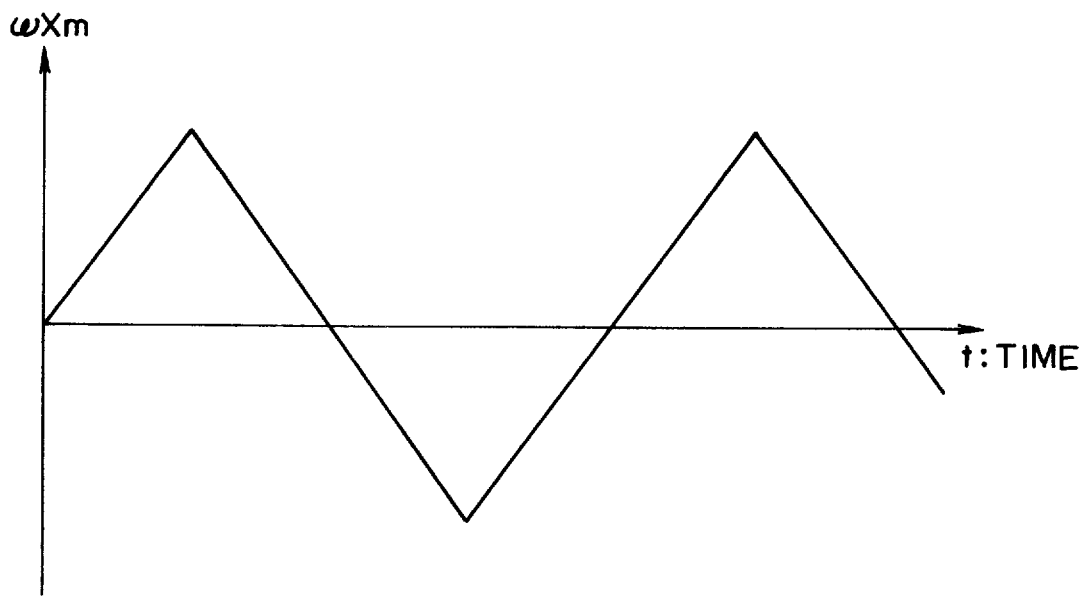
FIG. 14 is a graph for explaining a mirror driving method.

When the mirror 1002 is oscillated by the oscillating mechanism 1000, the intensity profile moves in the y direction along the mask surface in accordance with the rotational angle thereof. FIG. 11B illustrates in enlarged scale a portion of the intensity profile. As a result of oscillation of the mirror in the $wx_m$ direction, the unevenness shifts in the direction of the arrow. If a sufficient number of oscillations (times) are made within the exposure time period, the SR X-rays projected on the mask surface (wafer surface) and having non-uniformness are averaged within the period, and an average intensity profile has a smooth shape such as depicted by a broken line in FIG. 11B. And, consequently, the non-uniformness in the x direction is also smoothed. The drive of the mirror in the $wx_m$ direction for the mirror oscillation is performed to cause repeated straight reciprocation such as depicted in FIG. 14. In FIG. 14, the axis of the abscissa represents time, and the axis of the ordinate denotes the angle in the $wx_m$ direction. While the described example is a case where straight drive is performed, this is not always necessary. For example, drive along a sine curve may be adopted.

Since the SR X-rays have an intensity profile like a Gaussian distribution, oscillating a mirror causes a change in intensity of the SR X-rays within the view angle. The amplitude of oscillation of the mirror may thus preferably be set so as not to cause a change in magnitude of ±50% or more. This is because, if the change in intensity is large, the averaging effect to the non-uniformness of intensity attributable to an error in shape or uneven reflectivity of the mirror is reduced.

Now, the exposure amount correction through the shutter mechanism 1003 will be explained.

Non-uniformness in intensity attributable to an error in shape or unevenness of reflectivity of the mirror can be reduced by minute oscillation of the mirror, as described hereinbefore. However, there still remains an intensity profile of Gaussian distribution shape in the direction perpendicular to the electron orbit plane of the synchrotron ring, which the SR X-rays originally possess, and such an intensity distribution is present within the exposure view angle. In consideration thereof, in older to correct such an intensity distribution and thereby to assure a uniform exposure amount throughout the exposure view angle, the shutter mechanism 1003 controls the exposure time at respective positions in the y direction.

Figure 12A:
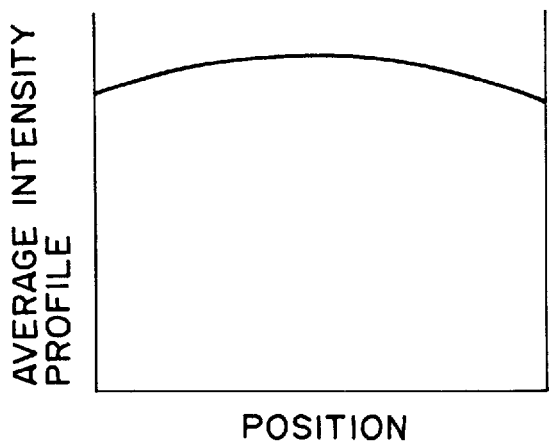
FIGS. 12A, 12B and 12C are schematic views for explaining the mariner of determining a shutter drive curve.
Figure 12B:
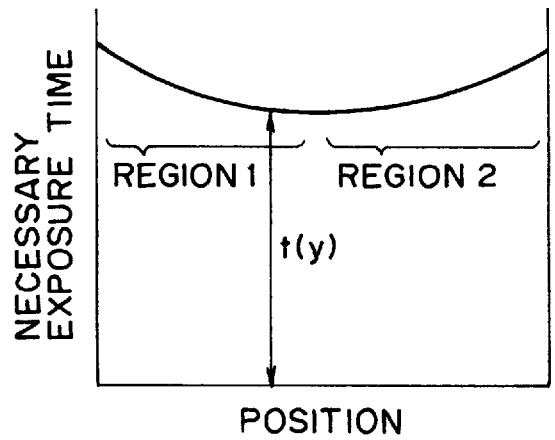
Figure 12C:
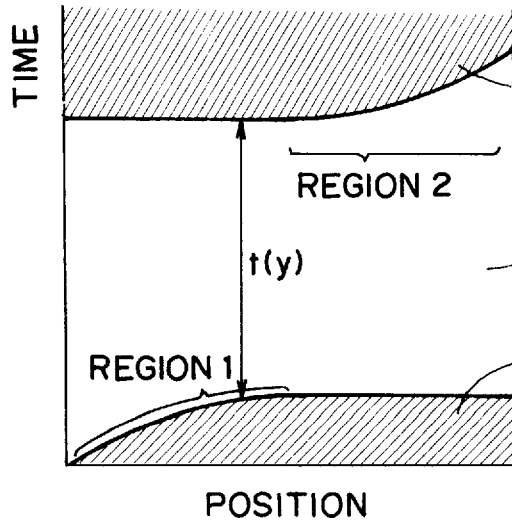

FIGS. 12A, 12B and 12C are views for explaining how to determine the drive curve for this shutter. FIG. 12A illustrates an average intensity profile as provided when the mirror is oscillated in the $wx_m$ direction. As a result of the oscillation, the non-uniformness in the x direction has decreased to a level not higher than a tolerance. This average intensity profile may be determined by calculation or through actual measurement. The exposure time at every position in the y direction may be determined by dividing the necessary exposure amount by the intensity at that position. The graph of FIG. 12B shows the exposure time at each position, as determined by calculation.

The shutter drive curve is determined on the basis of this exposure time curve. FIG. 12C shows a supposed shutter drive curve (leading edge and trailing edge) on an assumption that the shutter is movable at an infinite speed. Dividing the graph of FIG. 12B at the position of the minimum into a left-hand region 1 and a right-hand region 2, that portion of the leading edge drive curve of FIG. 12C which is present in the region 1 has a shape corresponding to the vertically inverted shape of the curve in the region 1 of FIG. 12B. Other than in this region, it has a straight shape parallel to the axis of abscissa. Also, that portion of the trailing edge drive curve of FIG. 12C which is present in the region 2 has a shape corresponding to that of the curve in the region 2 of FIG. 12B. Other than in this region, it has a straight shape parallel to the axis of the abscissa. However, since the SR X-rays are diffused, the shutter position and the SR X-ray position have to be corrected to some degree.

Figure 13:
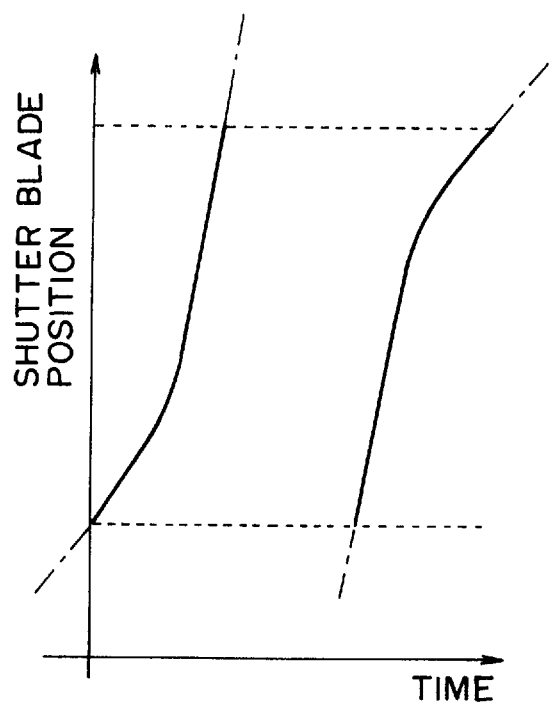
FIG. 13 is a schematic view of a determined shutter drive curve.

FIG. 13 shows an example of a finally determined shutter drive curve. What is illustrated in FIG. 12C is a supposed shutter drive curve on an assumption that the shutter is movable at an infinite speed. To the contrary, taking into account a practical movement speed of the shutter, a shutter drive curve will be such as shown in FIG. 13.

The foregoing description has been made of examples wherein the SR X-ray profile has only one peak, i.e., an upward convex shape. However, an appropriate shutter drive may be determined with similar processes as described, even when a mirror has a specific shape so that the intensity profile has two or more peaks.

Now, paying specific attention to a particular point on a mask surface, since the intensity changes within the exposure time period due to the oscillation of the mirror, even if the shutter is driven exactly in accordance with a determined drive curve, there may be produced a difference in exposure amount (corresponding to the integrated intensity) between different positions upon the mask surface. Such a difference in exposure amount leads to an additional factor of non-uniformness. This problem, however, may be solved by performing oscillations of a sufficient number with respect to each point on the mask during the exposure process. For example, if the intensity at a point on the mask changes (increases and/or decreases) by about 8% at the maximum during one reciprocal motion of the mirror, such additional non-uniformness may be reduced to about 0.1% by performing oscillations not less than 20 times.

Since in this embodiment the number (times) of mirror oscillations during the exposure time period is made sufficiently large, the drive of the shutter mechanism is done independently of (without a timed relation with) the mirror oscillation angle in the $wx_m$ direction. For this reason, there is no necessity of providing communication between the shutter mechanism 1003 and the mirror oscillation mechanism 1000, and thus, the structure is simple.

Embodiment 6

Figure 15:
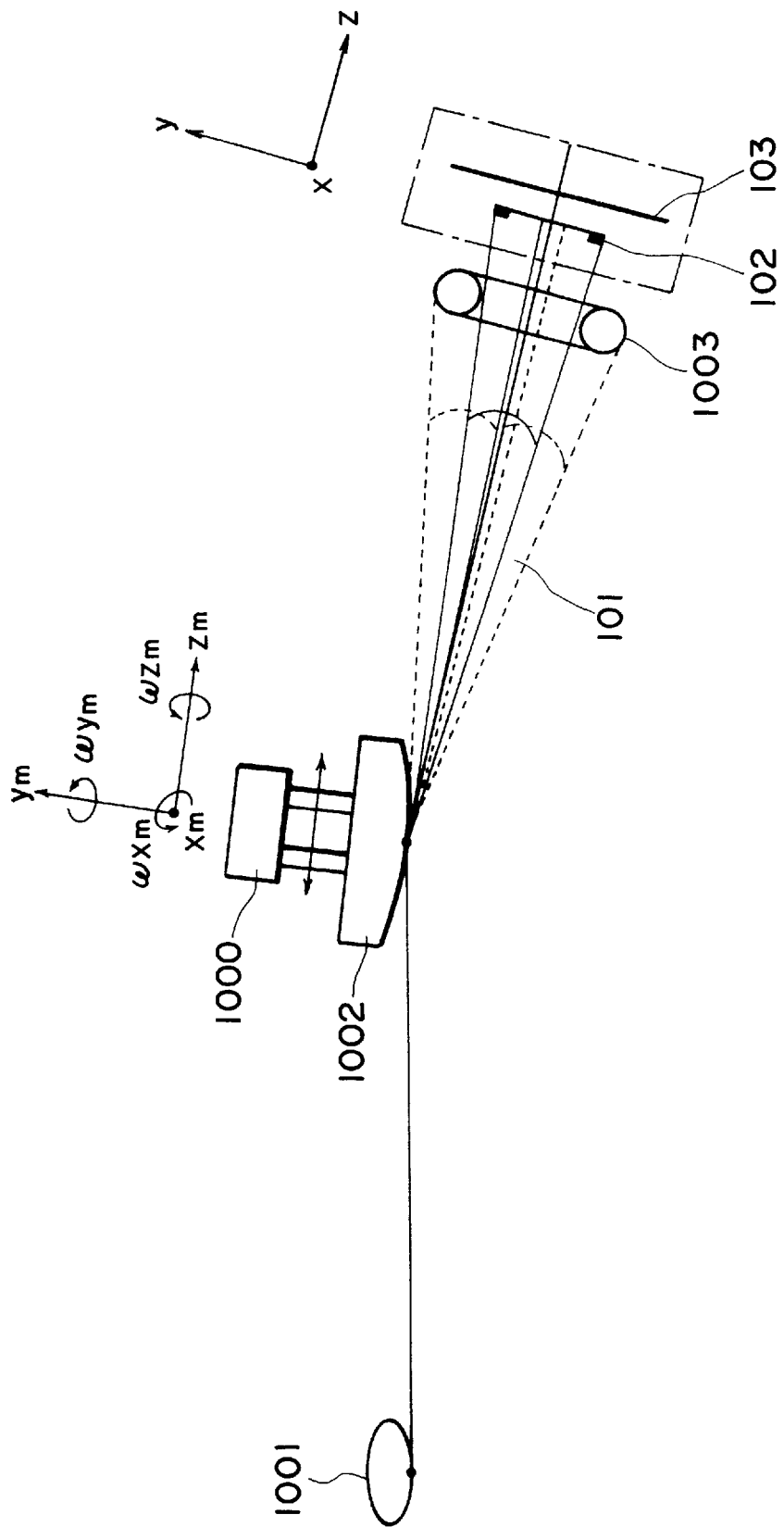
FIG. 15 is a schematic view of an exposure apparatus according to a sixth embodiment of the present invention.

Now, a sixth embodiment of the present invention will be described. In FIG. 15, like numerals as those of FIG. 9 are assigned to corresponding elements.

Figure 16:
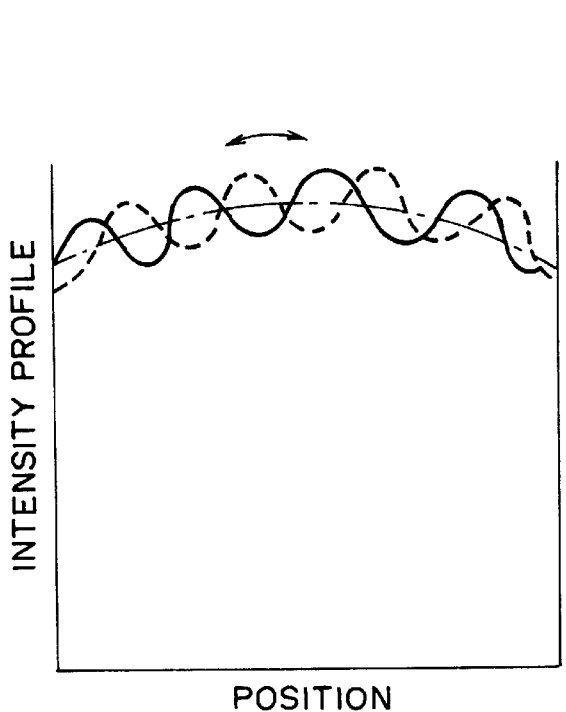
FIG. 16 is a schematic view of an intensity profile as provided when a mirror of the exposure apparatus of FIG. 15 is oscillated.

This embodiment has a feature that the mirror oscillation is not rotational oscillation in the $wx_m$ direction but straight oscillation in a $z_m$ direction. FIG. 16 shows changes in intensity profile with the movement distance of oscillation in this case. More specifically, FIG. 16 illustrates with exaggeration the non-uniformness attributable to an error in shape or unevenness of reflectivity of the mirror. As the mirror moves in the $z_m$ direction, the non-uniformness of illuminance due to the error in shape or unevenness of reflectivity of the mirror shifts. However, the values connecting centers (middles) of the irregularities (irregular heights) as depicted by a dash-and-dot line in FIG. 16 are substantially unchanged. This is because, as regards the original profile of the SR X-rays, the intensity profile does not change even with displacement of the mirror 1002 in the $z_m$ direction, whereas it changes largely due to the error in shape or unevenness of reflectivity of the mirror.

The mirror is driven in a similar manner as in the fifth embodiment, and it is oscillated at sufficient times during the exposure time period. The mirror drive may be straight such as shown in FIG. 14 or it may be done along a sine wave. The shutter drive curve may be determined in a similar way as in the fifth embodiment, on the basis of the average intensity profile.

Embodiment 7

Figure 17:
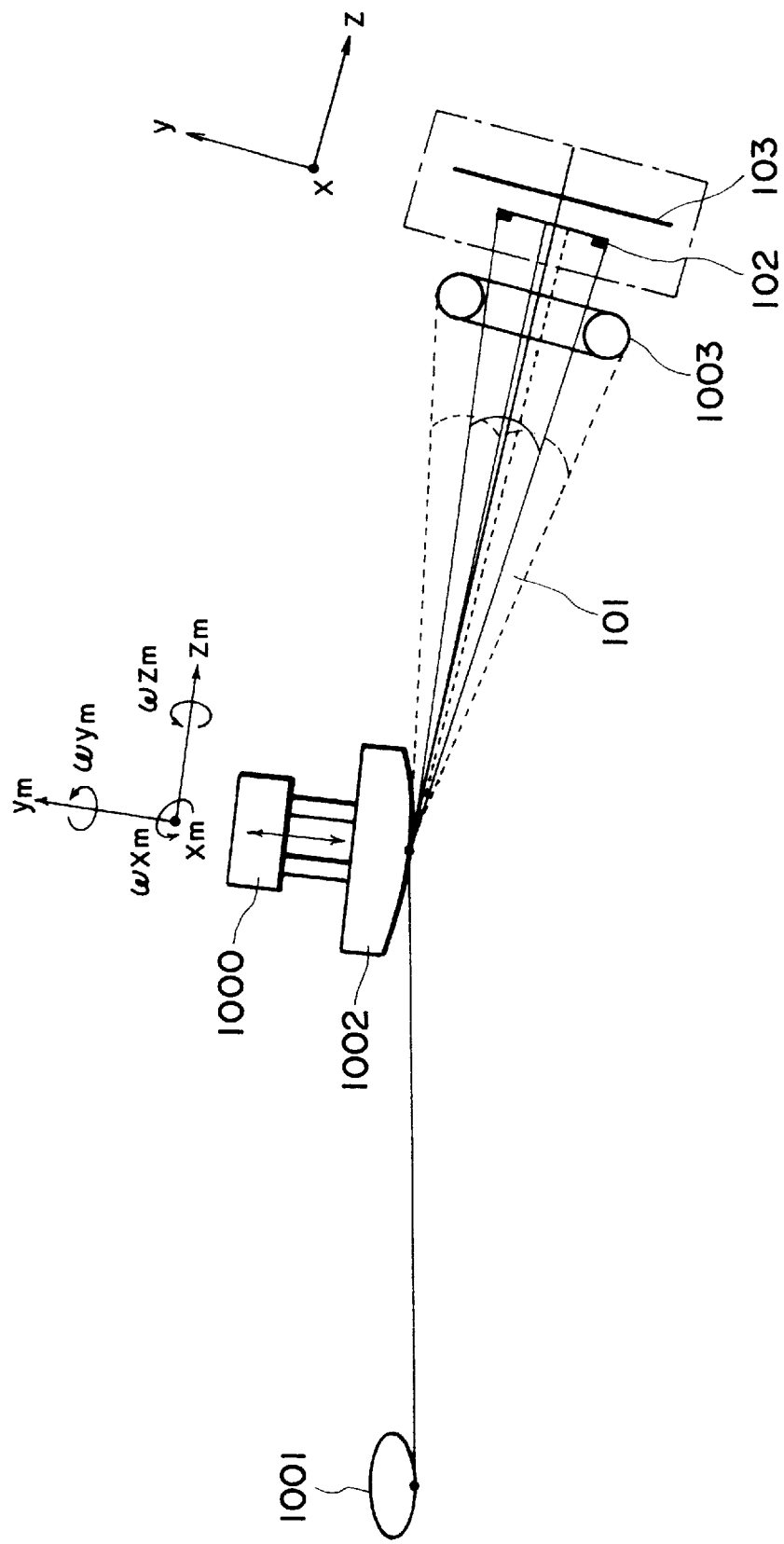
FIG. 17 is a schematic view of an exposure apparatus according to a seventh embodiment of the present invention.

FIG. 17 shows a seventh embodiment of the present invention, and like numerals as those of the fifth and sixth embodiments are assigned to corresponding elements.

Figure 18:
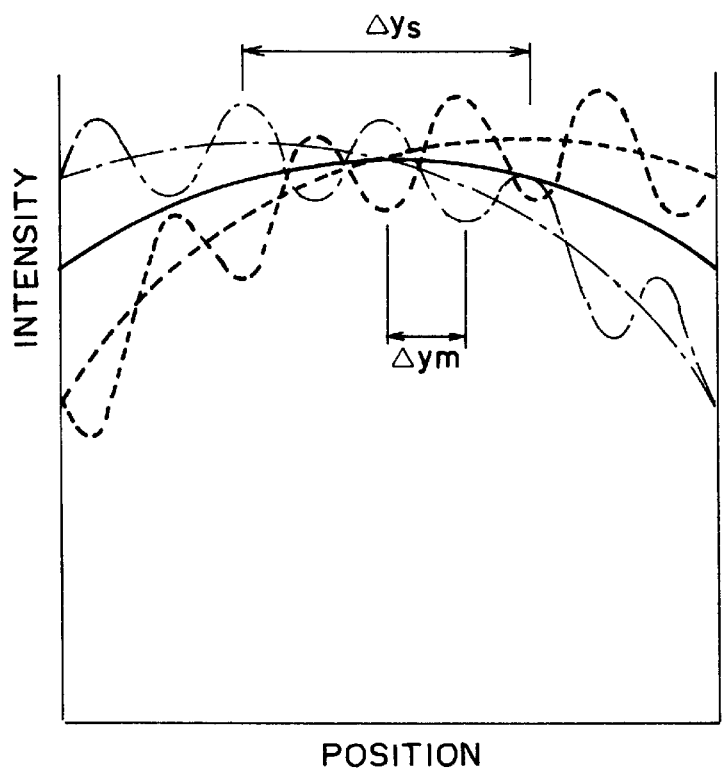
FIG. 18 is a schematic view of an intensity profile as provided when a mirror of the exposure apparatus of FIG. 17 is oscillated.

This embodiment differs from the fifth and sixth embodiments in that the mirror oscillation is not in the $wx_m$ direction or in the $z_m$ direction, but it is straight oscillation in a $y_m$ direction. FIG. 18 illustrates changes in intensity profile with the oscillation movement distance. In this case, the non-uniformness attributable to the mirror shifts by $\Delta y_m$ as depicted in the drawing, whereas the line connecting the intensity profile centers (it corresponds to the intensity profile to be provided in a case where the mirror has no error in shape or unevenness of reflectivity) displaces by $\Delta y_s$. For example, if the distance from the synchrotron light source to the mirror is 7 m, the distance from the mirror to the mask surface is 4 m, and the curvature radius of the cylindrical mirror is 50 m, then approximately there is a relation $\Delta y_m : \Delta y_s = 1:10$. The shift of non-uniformness results in substantial cancellation of the non-uniformness, and thus the average intensity profile has a smooth shape such as depicted by a solid line.

The mirror drive may be made in a similar manner as in the fifth embodiment, and it is oscillated a sufficient number of times during the exposure time period. As regards the driving method, the mirror may be driven rectilinearly as in the FIG. 14 example, or it may be driven along a sine wave. The shutter drive curve may be determined in a similar way as in the fifth embodiment, on the basis of the average intensity profile.

Embodiment 8

Figure 19:
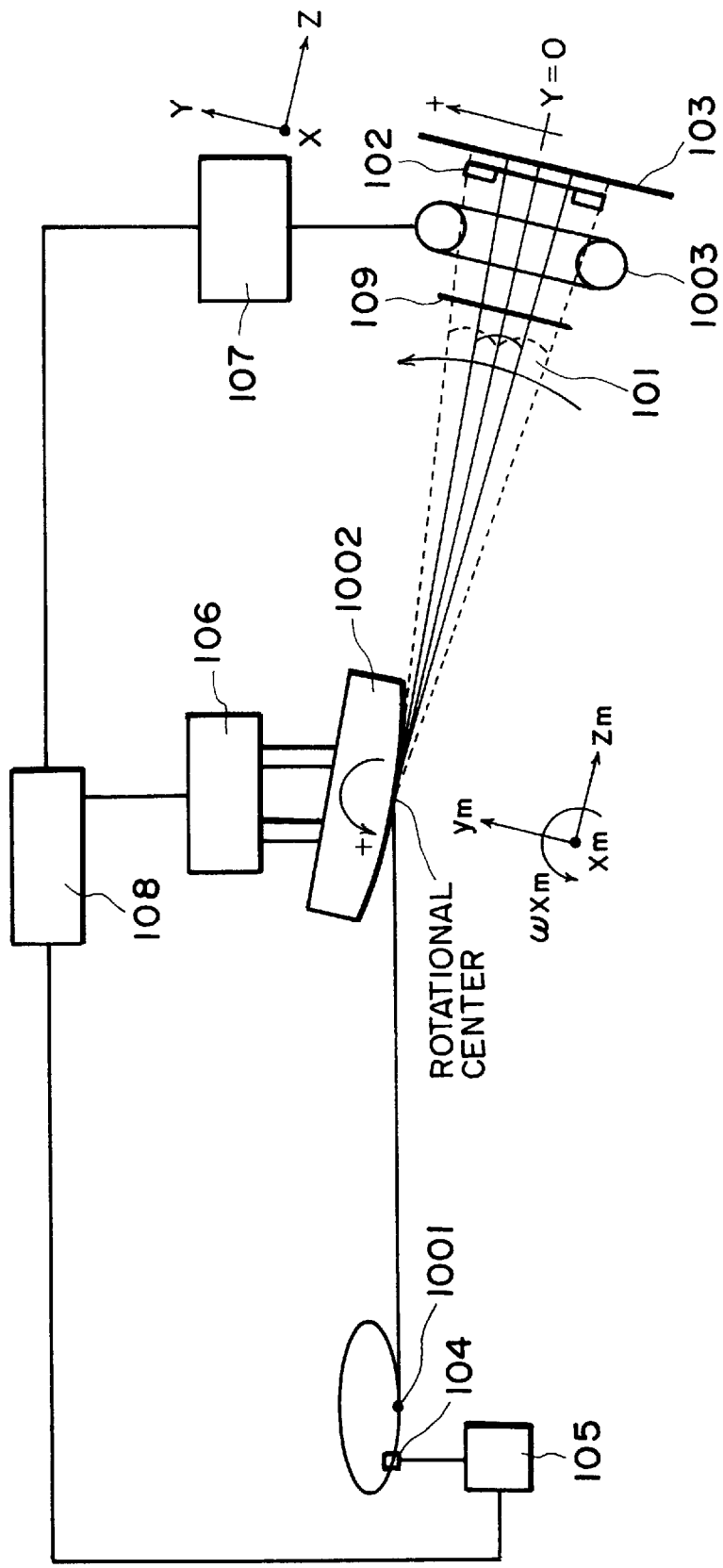
FIG. 19 is a schematic view of an exposure apparatus according to an eighth embodiment of the present invention.

FIG. 19 shows an eighth embodiment of the present invention. Denoted at 1001 is a synchrotron ring (exposure light source), and it produces synchrotron radiation light. In this embodiment, light in the soft X-ray wavelength region contained in the produced light is used. Denoted at 1002 is a mirror with a convex reflection surface having a predetermined curvature The mirror 1002 serves to expand the synchrotron radiation light emitted from a light emission point of the synchrotron ring 1001, in a direction perpendicular to the electron orbit plane of the synchrotron ring, and for this purpose the mirror 1002 has a curvature along the direction of a chief ray of the projected synchrotron radiation light. Particularly, in this embodiment, it has a curvature radius of 50 m.

The mirror 1002 can be rotationally moved by a mirror driving Mechanism 106, about a rotational axis extending perpendicular to the chief ray and within the electron orbit plane of the synchrotron ring. Denoted at 1003 is a shutter unit for controlling the time for projecting the synchrotron radiation light, reflected by the mirror, to a mask 102 and a wafer 103. The shutter unit 1003 has a structure that a light blocking belt having an opening with a leading edge and a trailing edge moves relative to the radiation light to thereby determine the timing of a start and an end of exposure at each position within the exposure region, as has been described with reference to FIG. 33.

Denoted at 108 is a control device for controlling the shutter unit 1003 and the mirror 1002. As will be described later, it serves to perform computation for timed control of the mirror 1002 and the shutter unit 1003 on the basis of an accumulated electric current level of the synchrotron ring, and to control and actuate a mirror driving mechanism 106 and a shutter driving means 107. Denoted at 104 is a sensor for detecting the accumulated electric current level of the synchrotron ring, and a measured value of the sensor 104 is transferred to the control device 108 through a communicating device 105.

The synchrotron ring 1001 and the mirror 1002 are disposed within an ultra high vacuum ambience, and the portion which is downstream of the shutter unit 1003 is disposed within a reduced pressure helium gas (150 Torr). The boundary between the ultra high vacuum ambience and the reduced pressure helium gas ambience is vacuum-sealed by means of a beryllium thin film 109. In consideration of a possibility that driving the shutter unit in a vacuum causes degasification and adversely affects the vacuum level and for the reason that oil is not usable in the driving portion so that use of a special material member is necessitated, the shutter unit 1003 is disposed outside the ultra high vacuum ambience.

The wafer 103 has a plurality of divided regions (zones) on which plural mask patterns are to be transferred, and the wafer is to be processed by sequential exposures in a step-and-repeat exposure process. Upon completion of exposure of one shot (zone), the wafer 103 is moved by a stepping mechanism having a stage to the subsequent exposure shot position, and this is repeated.

Figure 20:
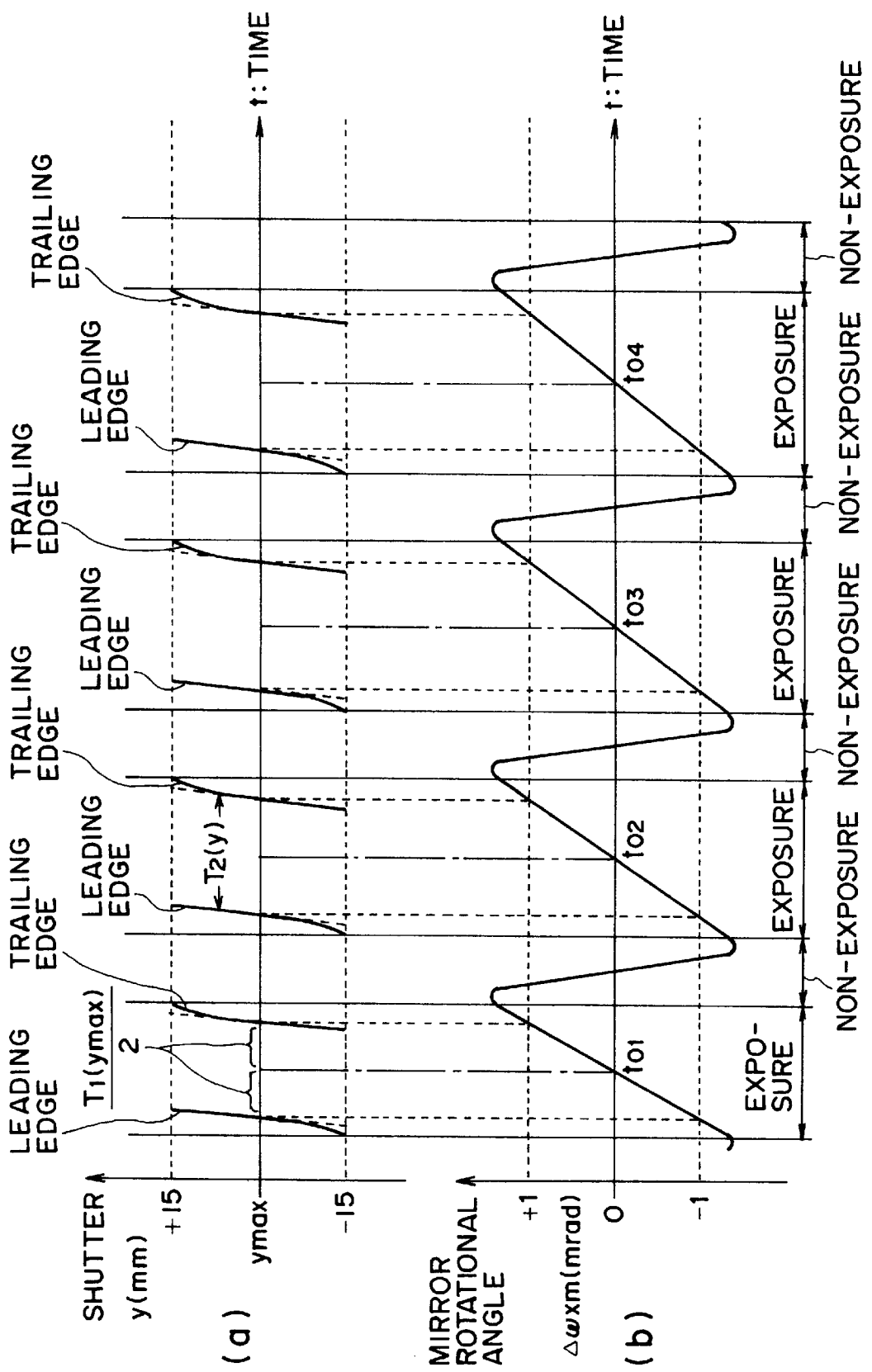
FIG. 20 is a schematic view for explaining synchronized drive of a shutter and a mirror.

Now, the manner of driving the shutter unit will be explained. FIG. 20 is a graph, showing a drive curve for the light blocking belt of the shutter and a drive curve for the mirror. Portion (a) of FIG. 20 illustrates a graph of shutter motion, wherein the axis of the abscissa denotes time. Here, for ease in understanding, the axis of the ordinate denotes the coordinates upon the mask surface on which the shutter edge is projected. It does not represent the actual movement distance of the shutter. Since the synchrotron radiation light is expanded in the y direction (direction perpendicular to the electron orbit plane of the synchrotron ring), the actual movement amount of the shutter in the y direction is slightly smaller than y in the graph. The exposure view angle has a square shape with a length 30 mm in each side, and the size with respect to which the exposure amount should be controlled by the shutter is ±15 mm in the y direction. Thus, the shutter motion only within the range of ±15 mm is illustrated in the graph. On the other hand, the portion (b) of FIG. 20 shows a graph illustrating the rotational drive of the mirror in the $wx_m$ direction. The axis of the abscissa denotes time, and the axis of the ordinate represents the rotational angle of the mirror. In the portions (a) and (b) of FIG. 20, the time axes are of the same scale. During the exposure period, the mirror is driven at a constant speed and in one direction, from the negative direction to the positive direction. During the non-exposure period, the mirror returns to its drive start position and, also, the wafer 103 is moved to the succeeding exposure position by the stepping mechanism. The incidence angle of the synchrotron radiation light upon the mirror is initially set at 15 mrad. The mirror is rotated while taking this position as an origin of rotation in the wx direction. The rotational angle is denoted by $\Delta wx_m$.

The timed relation between the mirror rotational angle and the shutter drive will now be explained. In this embodiment, it is so controlled that, at the position in the y direction within the view angle whereat during the exposure period the exposure time may be shortest (namely, the position whereat the average intensity is strongest), the amount of displacement of the profile of the synchrotron radiation light becomes constant. More specifically, if the intensity of the synchrotron radiation light decreases with attenuation of the accumulated electric current level of the synchrotron, the shortest exposure time within the view angle becomes larger. Thus, the mirror rotational speed has to be decreased correspondingly. The mirror drive is so controlled that: for each shot, during the time period in which the position of shortest exposure time (the position $y_{max}$ in FIG. 20($a$)) is irradiated, the mirror rotates from $-1$ mrad to $+1$ mrad and, if the exposure time at the position $y_{max}$ is denoted by $T(y_{max})$, the mirror rotational angle $\Delta wx$ becomes equal to 0 mrad when the position $y_{max}$ is exposed by $T(y_{max})/2$.

Next, the manner of determining the shutter drive curve will be explained. For each shot, the shutter drive curve is calculated quickly through the computing operation of the control device 108. A drive command based on the calculated drive curve is applied to the shutter driving device 7, and the shutter 1003 is driven accordingly.

The function of the shutter is to make uniform the exposure amount over the whole mask surface in timed relation with the mirror rotation. Also, it serves to cause rotation of the mirror from $-1$ mrad to $+1$ mrad during the exposure period, at the position of shortest exposure time. This is to assure the effect of reducing an error in shape or unevenness of reflectivity of the mirror throughout the view angle.

Details of how to drive the shutter will be explained below. FIG. 21 shows intensity profiles upon the mask surface with changing $wx_m$ of the mirror. The solid line depicts the intensity profile when $\Delta wx_m = 0$. The dash-and-dot line depicts the intensity profile when $\Delta wx_m = +1$ mrad. The broken line depicts the intensity profile when $\Delta wx_m = -1$ mrad. With rotation of the mirror, the intensity profile of the synchrotron radiation light shifts in the y direction without substantial change in shape thereof. The amount of displacement is proportional to the mirror rotational angle. If the distance between the mirror and the mask is 4 m, a change of $\Delta wx_m$ by $\pm 1$ mrad causes a shift of the intensity profile through 16 mm.

The graphs of FIGS. 22A, 22B and 22C show intensity changes with different angles, with respect to the y positions on the mask. In these drawings, the axis of the abscissa denotes the mirror rotational angle $\Delta wx_m$, and the axis of the ordinate denotes the intensity of the synchrotron radiation light. FIG. 22A illustrates the intensity change at the position y =+15 mm, FIG. 22B illustrates the intensity change at the position y=0 mm, and FIG. 22C illustrates the intensity change at the position y=$-$15 mm. At about the center of the mask surface, the peak is about at $\Delta wx_m = 0$. In the positive side of the y direction of the view angle, the intensity becomes higher with increases of $\Delta wx_m$. In the negative side, the intensity becomes lower with increases of $\Delta wx_m$.

Figure 23:
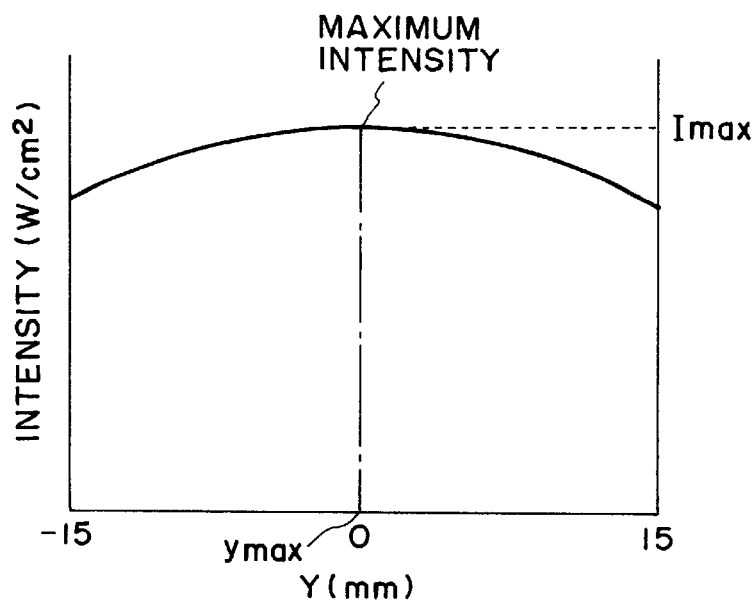
FIG. 23 is a schematic view of an average intensity profile of synchrotron radiation light as provided when a mirror is rotationally moved.

The intensity changes with different angles may be determined through measurement or calculation. The graph of FIG. 23 shows the average intensity at each y position as the mirror is rotated from $-1$ mrad to $+1$ mrad. In this graph, the y position whereat the average intensity is highest is denoted by $y_{max}$. This position provides a reference for the timed relation of the mirror drive and the shutter drive. If the peak value thereof is denoted by $I_{max}$ and the necessary exposure amount is denoted by D, then the exposure time $T(y_{max})$ at the position $y_{max}$ is given by:

$$T(y_{max}) = D/I_{max} \qquad (1)$$

The mirror movement speed v for swinging the mirror from $-1$ mrad to $+1$ mrad is:

$$v = 2/T(y_{max})[mrad/s] \qquad (2)$$

Figure 24:
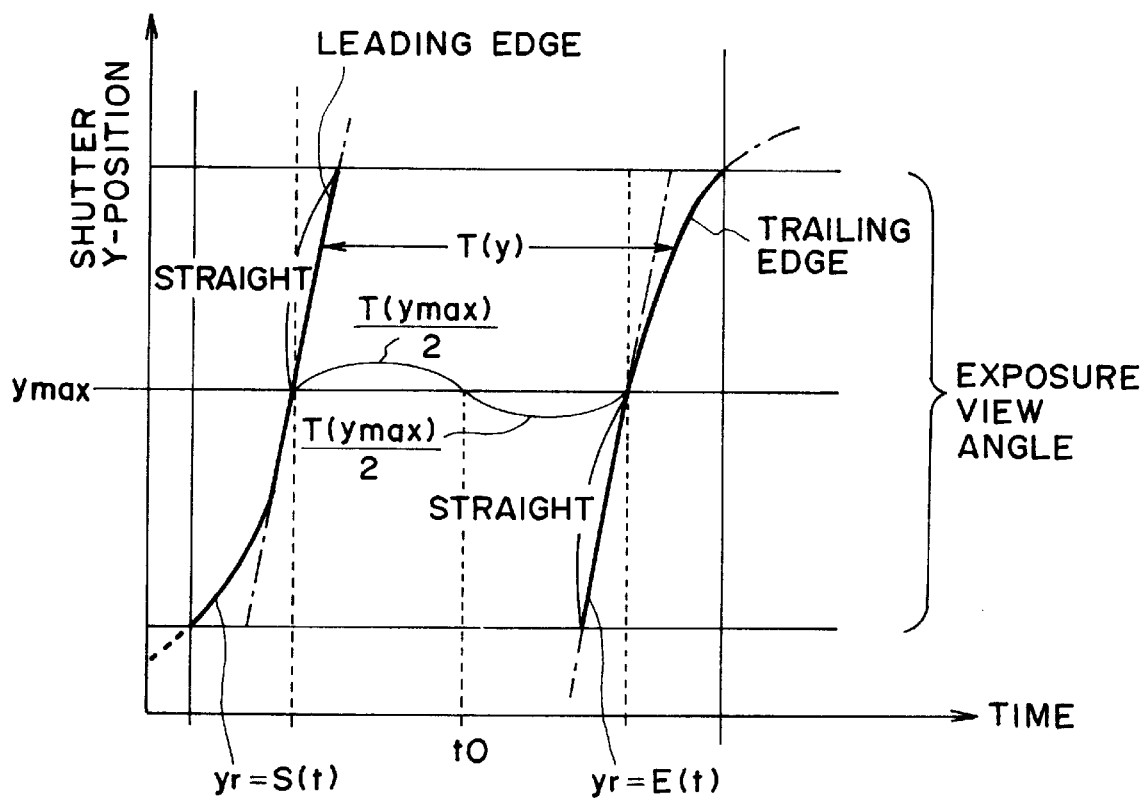
FIG. 24 is a schematic view of a shutter drive curve.

Then, with respect to every y position, determination of the time moment of passage of the leading edge as well as the time moment of passage of the trailing edge is performed. FIG. 24 shows a shutter drive curve for one shot. The axis of the ordinate denotes the shutter position, and the axis of the abscissa denotes time. As the leading edge passes, the exposure starts. As the trailing edge passes, the exposure stops. A leading edge drive curve is depicted at $y_f = S(t)$, while a trailing edge drive curve is depicted at $y_r = E(t)$. The portion of the curve $y_f = S(t)$ which is larger than $y_{max}$ and the portion of the curve $y_r = E(t)$ which is smaller than $y_{max}$ are straight. Namely, within this region, the shutter is moved at a constant speed. This speed can be set independently of the shape of the intensity profile of the synchrotron radiation light. Thus, in order to reduce the total exposure time for one shot and to enlarge the throughput, preferably this speed should be larger. Therefore, in this range (straight shutter movement range), the shutter is driven at the maximum shutter unit speed. This speed is now denoted by $V_s$. If the time moment at which the position $y_{max}$ has been exposed up to a half amount is denoted by $t_0$, the straight drive portion can be expressed as follows:

$$y_f = V_s\{t - t_0 + T(y_{max})/2\} + y_{max} \qquad (3)$$

$$y_r = V_s\{t - t_0 - T(y_{max})/2\} + y_{max} \qquad (4)$$

The drive curve portions other than this range can be determined by solving the following integration equation, wherein $t_s$ denotes the exposure start time moment and $t_e$ denotes the exposure end time moment:

$$\int_{t_s}^{t_e} I_y(t)dt = D \qquad (5)$$

Within the range in which y is larger than $y_{max}$, $t_s$ can be detected from equation (3), such that $t_e$ can be determined by substituting $t_s$ into equation (5). In the range in which y is smaller than $y_{max}$, $t_e$ can be detected from equation (4), such that $t_s$ can be determined by substituting $t_e$ into equation (5).

Figure 25A:
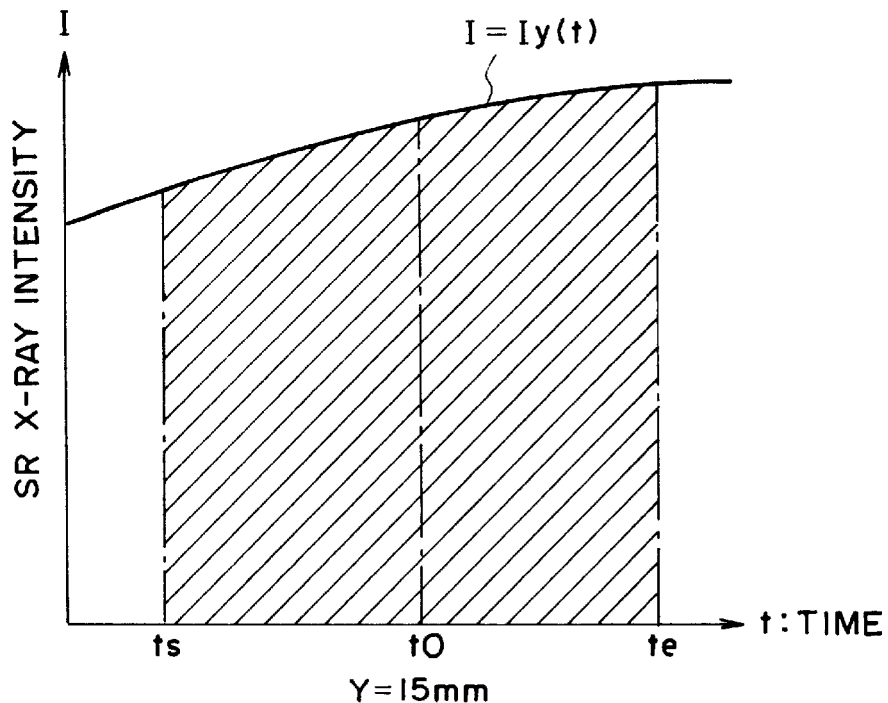
FIGS. 25A and 25B are schematic views for explaining the relation between time and intensity of synchrotron radiation light impinging on a mask, as well as the exposure amount.
Figure 25B:
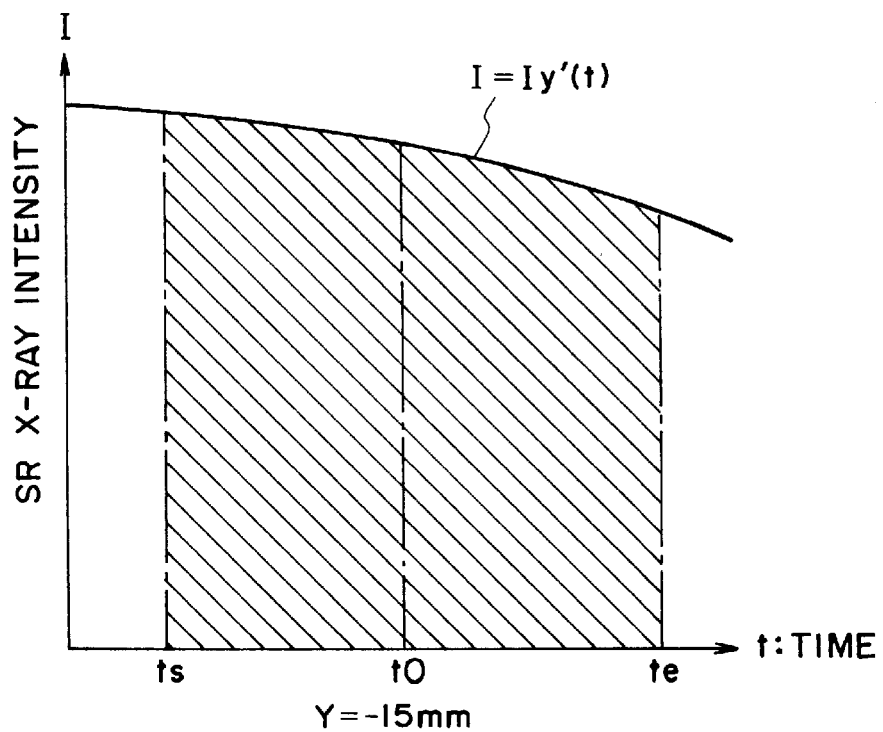

$I_y(t)$ represents the intensity of the synchrotron radiation light at each moment t. Namely, since the mirror rotational speed is v which can be determined by equation (2) and which is constant and since the mirror rotational angle $\Delta wx_{max}$ is equal to zero at the time when $t=t_0$, the intensity $I_y(t)$ corresponds to the FIG. 22 graph level with the axis of the abscissa being converted into the time axis. This is illustrated in the graph of FIG. 25A or 25B. The intensity $I_y(t)$ has a shape which changes with the position y on the mask surface, and FIGS. 25A and 25B illustrate the intensity $I_y(t)$ at a position y=$-$15 mm and the intensity $I_y(t)$ at a position y=$-$15 mm, respectively. The exposure amounts at the respective positions correspond to the areas of the respective hatched regions, and time moments $t_s$ and $t_e$ are so set that the area of the hatched region becomes equal to D.

By determining the shutter drive curve in accordance with the processes described above, a graph such as depicted in FIG. 24 is obtainable. By driving the shutter in accordance with this shape and by rotationally moving the mirror once from below to above through a small distance, the whole mask surface is exposed uniformly.

The processes described above are the exposure control and the shutter and mirror drives for exposure of one shot. Practically, the mirror and shutter drive curves should preferably be calculated with respect to each of the shots (zones). This is because the synchrotron radiation light (light source) has a property that the accumulated current attenuates with time and, as a result, the intensity of synchrotron radiation light decreases with the attenuation. As regards such attenuation within the time period of one exposure, no correction may be made since it is small as within the range of tolerance. However, as regards the attenuation with respect to different shots, the accumulated current of the synchrotron ring may be monitored by the sensor 104, the intensity of the synchrotron radiation light may be calculated from the level being monitored, and the exposure amount May be controlled in accordance with the calculated intensity.

Calculations according to equations (1)–(5) are performed during a non-exposure period between adjacent shots, and the mirror drive curve and the shutter drive curve are determined. The accumulated current level of the synchrotron and the intensity thereof are in a substantially proportional relation, and only the magnitude becomes smaller without a change in shape. Thus, the shape of the intensity profile of the synchrotron radiation light is once measured and memorized into a memory. The drive curves for each shot can be calculated from the memorized level and the intensity of synchrotron radiation light (accumulated current level of the synchrotron ring) at that moment.

The intensity profile of the synchrotron radiation light on the basis of which the shutter and the mirror are driven, is unchangeable unless the position of the synchrotron ring, the position of the mirror or the position of the mask is changed. Thus, the profile measurement may be made only once after the exposure apparatus is set.

Advantageous effects of this embodiment will be explained below.

Reducing an error in shape or unevenness of reflectivity of a mirror into a very small range of high tolerance requires a large cost. With the exposure method according to the present embodiment, however, non-uniformness of exposure amount attributable to an error in shape or unevenness of reflectivity of a mirror can be averaged by rotationally moving the mirror by a small amount. The non-uniformness of exposure amount is thus substantively reduced. This effectively results in decreased cost of the mirror manufacture.

Reduction of non-uniformness by the present embodiment will be described in more detail, below.

Figure 26A:
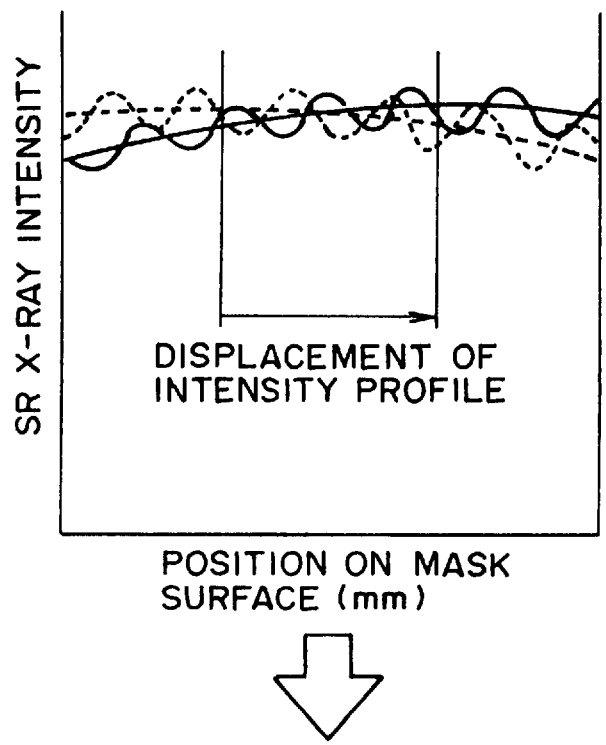
FIGS. 26(a) and 26(b) are schematic view for explaining, with exaggeration, an intensity profile in a case wherein a mirror has an error in shape and a non-uniform reflectivity.

Generally, a mirror has a small error in shape or a small unevenness of reflectivity. FIG. 26(a), shows the profile of synchrotron radiation light as provided on a mask surface when such a mirror is used. For better understanding, the non-uniformness is illustrated with exaggeration. The axis of the abscissa denotes the y-axis position on the mask surface, and the axis of the ordinate denotes the intensity. In a case where a mirror has completely no error in shape or completely no unevenness of reflectivity and also where the synchrotron radiation light has no non-uniformness attributable to any other factor, the intensity distribution with respect to the x-axis position is even. Practically, however, a mirror has an error in shape and/or unevenness of reflectivity having a distribution with respect to the position in the x direction. As a result, the intensity profile of the synchrotron radiation light projected on the mask surface also has a distribution with respect to the x direction. The profile shown in FIG. 26(a), is representative one at a certain x position. In FIG. 26, part (a), a solid line depicts a profile when $\Delta wx_m = -1$ mrad, and a broken line depicts a profile when $\Delta wm_x = 1$ mrad. The profile has a shape which corresponds to a shape to be provided by combining a Gaussian distribution shape (which the synchrotron radiation light originally possesses) with the error in shape or unevenness of reflectivity of the mirror.

Figure 26B:
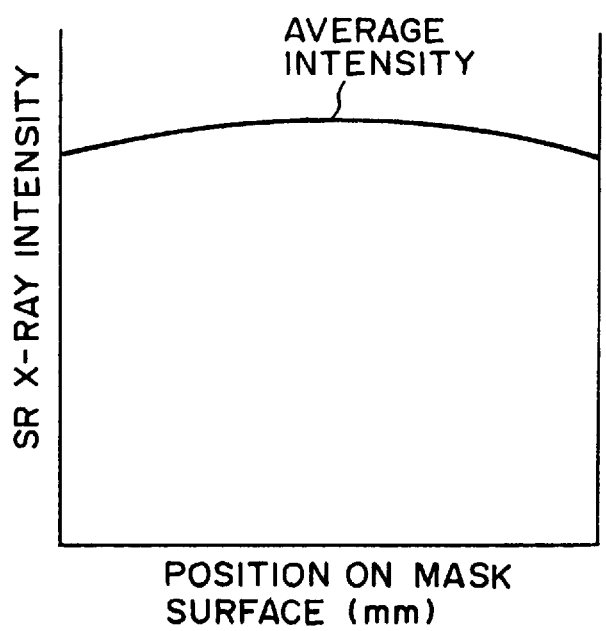

In this embodiment, during the exposure period, the mirror is rotationally moved through a small distance as a result of which local small unevenness within the view angle displaces in the y direction. Thus, the average intensity during the exposure period becomes small such as illustrated in FIG. 26(b). Consequently, non-uniformness in the x direction is smoothed.

Since the synchrotron radiation light has an intensity profile like a Gaussian distribution, rotationally moving a mirror causes a change in intensity of the synchrotron radiation light within the view angle. The angle of rotation of the mirror may thus preferably be set so as not cause a change in magnitude of ±50% or more. This is because, if the change in intensity is large the averaging effect to the non-uniformness of intensity attributable to an error in shape or uneven reflectivity of the mirror is reduced.

Embodiment 9

Figure 27:
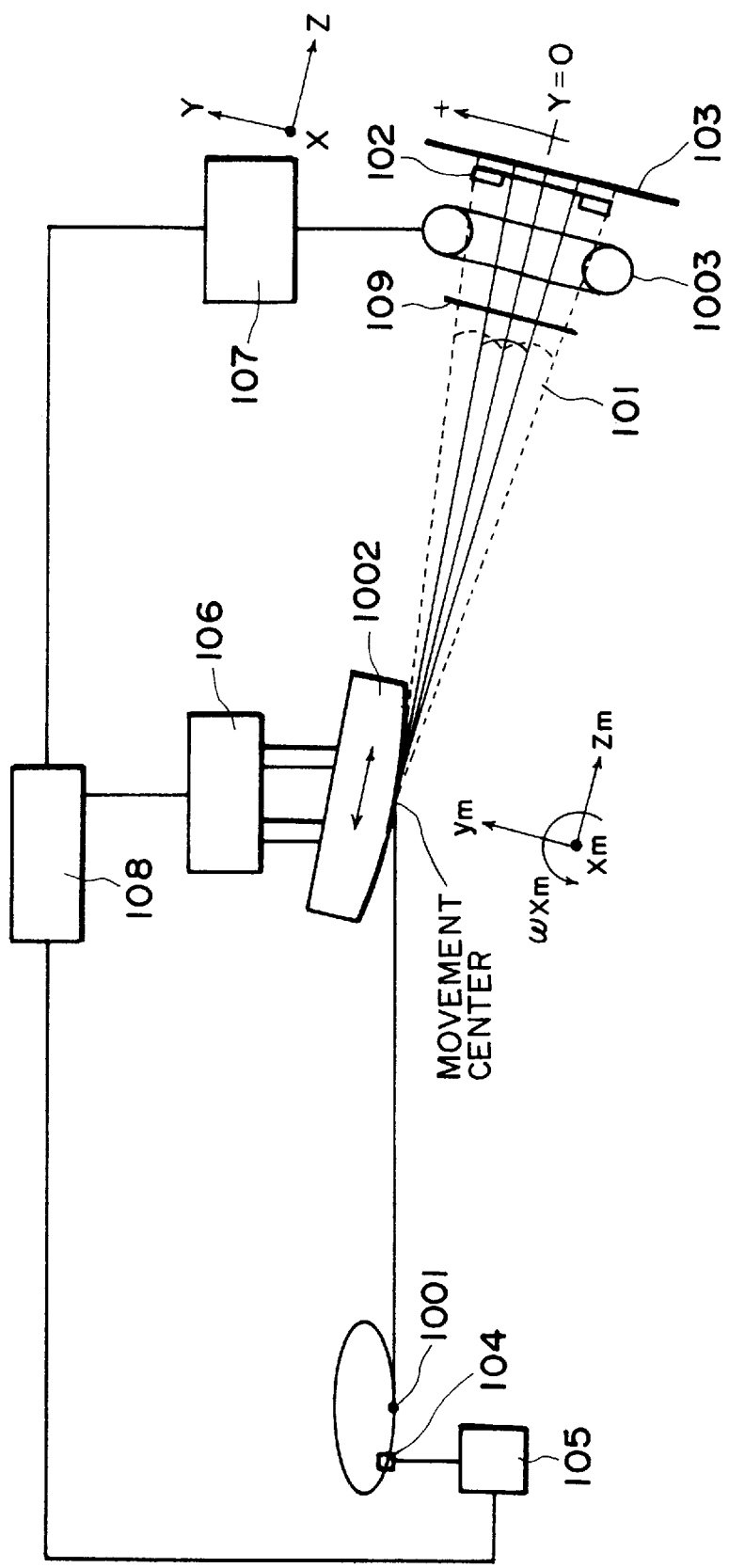
FIG. 27 is a schematic view of an exposure apparatus according to a ninth embodiment of the present invention.

Referring now to FIG. 27, a ninth embodiment of the present invention will be described. Like numerals as those of FIG. 19 are assigned to corresponding elements.

This embodiment has a feature that the movement direction of the mirror 1002 is in the direction of the arrow shown in the drawing, that is, in a $z_m$ direction. Also, in the case where the mirror is moved in the $z_m$ direction, the intensity changes with the movement. Similarly to the eighth embodiment, for every exposure within one shot area, the mirror is moved once rectilinearly along the $z_m$ direction and, by controlling the shutter in a timed relation therewith, local non-uniformness is reduced and uniform exposure is performed.

Embodiment 10

Figure 28:
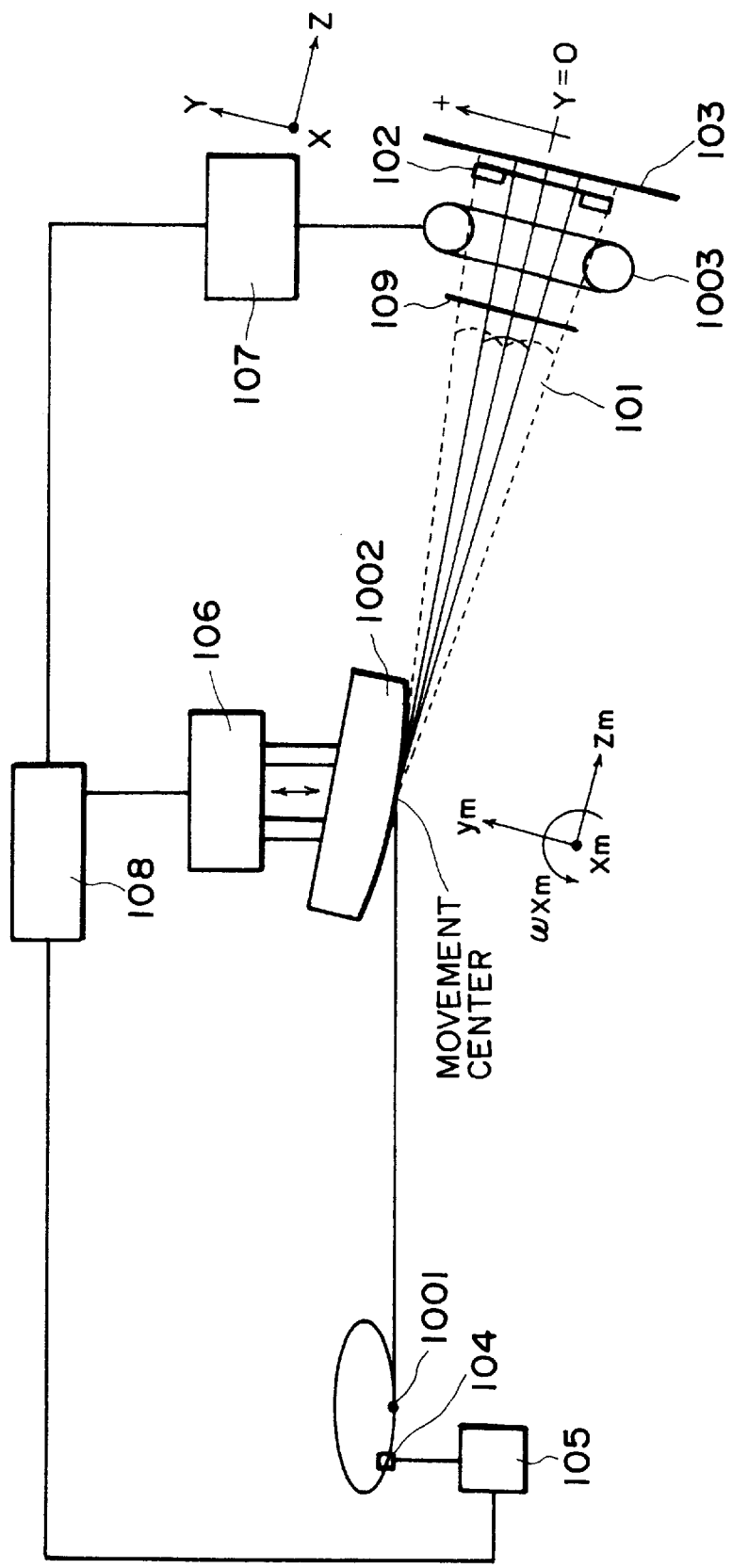
FIG. 28 is a schematic view of an exposure apparatus according to a tenth embodiment of the present invention.

Referring now to FIG. 28, a tenth embodiment of the present invention will be described. Like numerals as those of the preceding embodiments are assigned to corresponding elements.

This embodiment has a feature that the movement direction of the mirror 1002 is in the direction of the arrow shown in the drawing, that is, in a $y_m$ direction. With the mirror movement in the $y_m$ direction, the intensity changes. Similarly to the preceding embodiment, for every exposure, the mirror is moved once rectilinearly in the $y_m$ direction and, by controlling the shutter in a time relation therewith, local non-uniformness is reduced throughout the exposure view angle and uniform exposure is assured.

Embodiment 11

Next, an embodiment of a device manufacturing method which uses an exposure apparatus according to any one of the preceding embodiments, will be explained.

Figure 29:
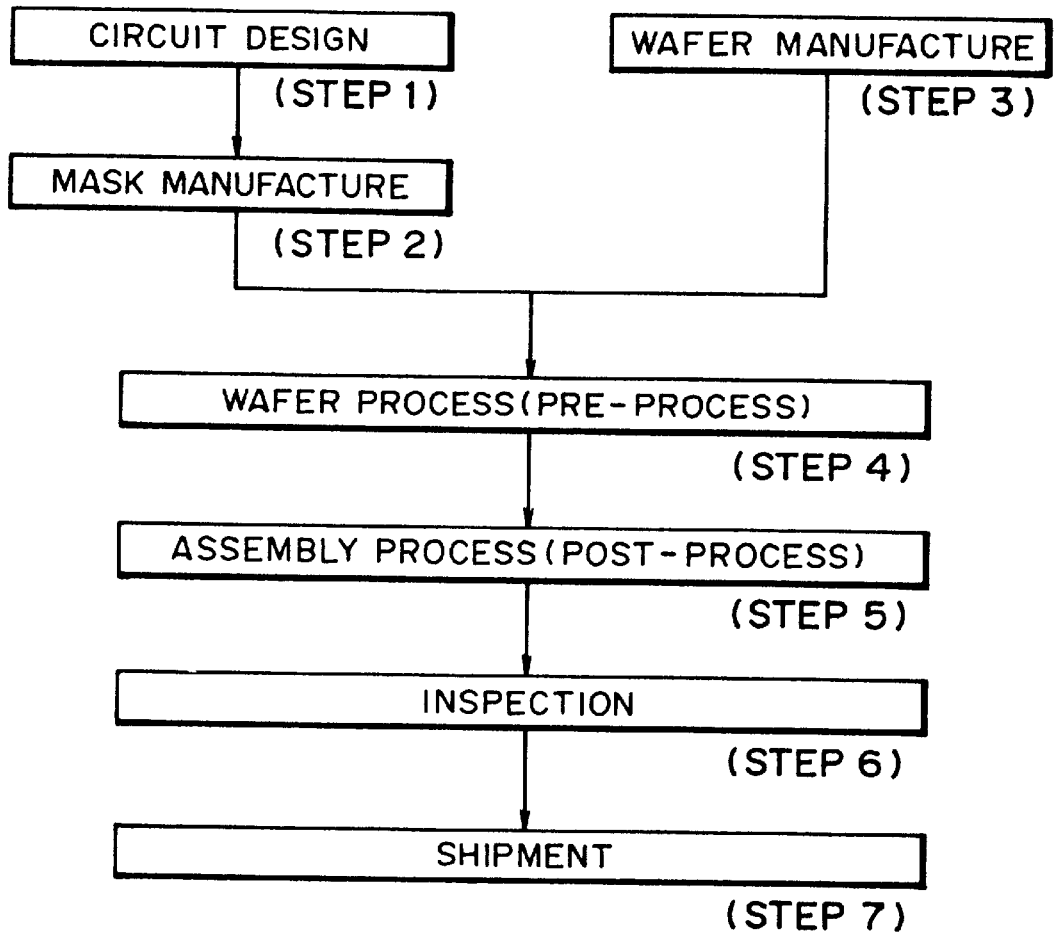
FIG. 29 is a flow chart of semiconductor device manufacturing processes.

FIG. 29 is a flow chart of the sequence of manufacturing a semiconductor device such as a semiconductor chip (e.g., IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step. 7).

Figure 30:
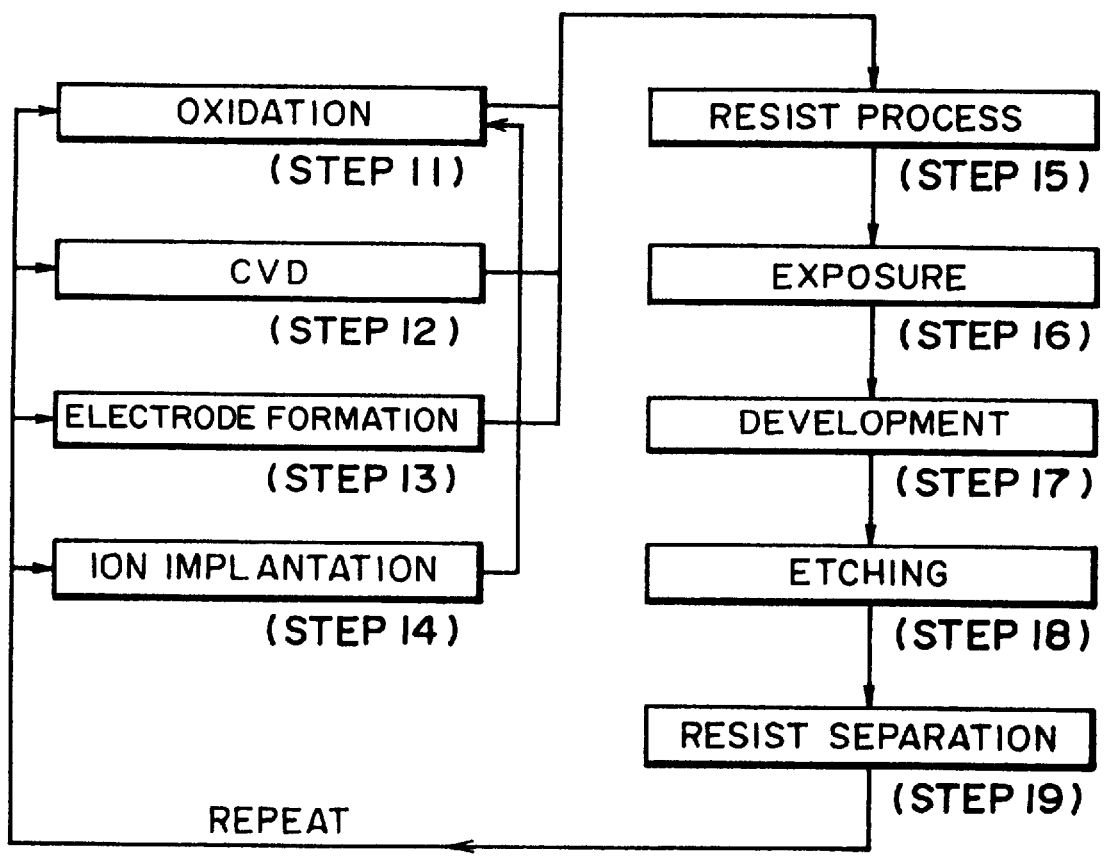
FIG. 30 is a flow chart of a wafer process.
Figure 31:
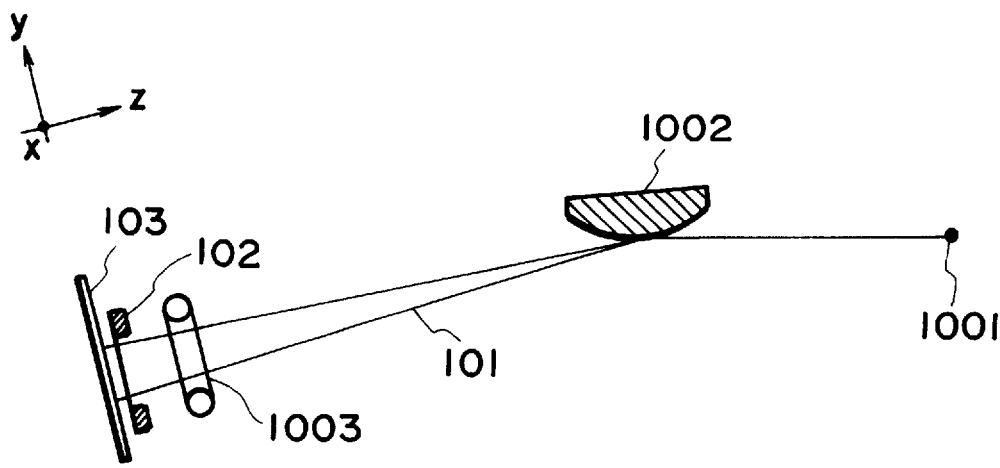
FIG. 31 is a schematic view of a known type of exposure apparatus.
Figure 32:
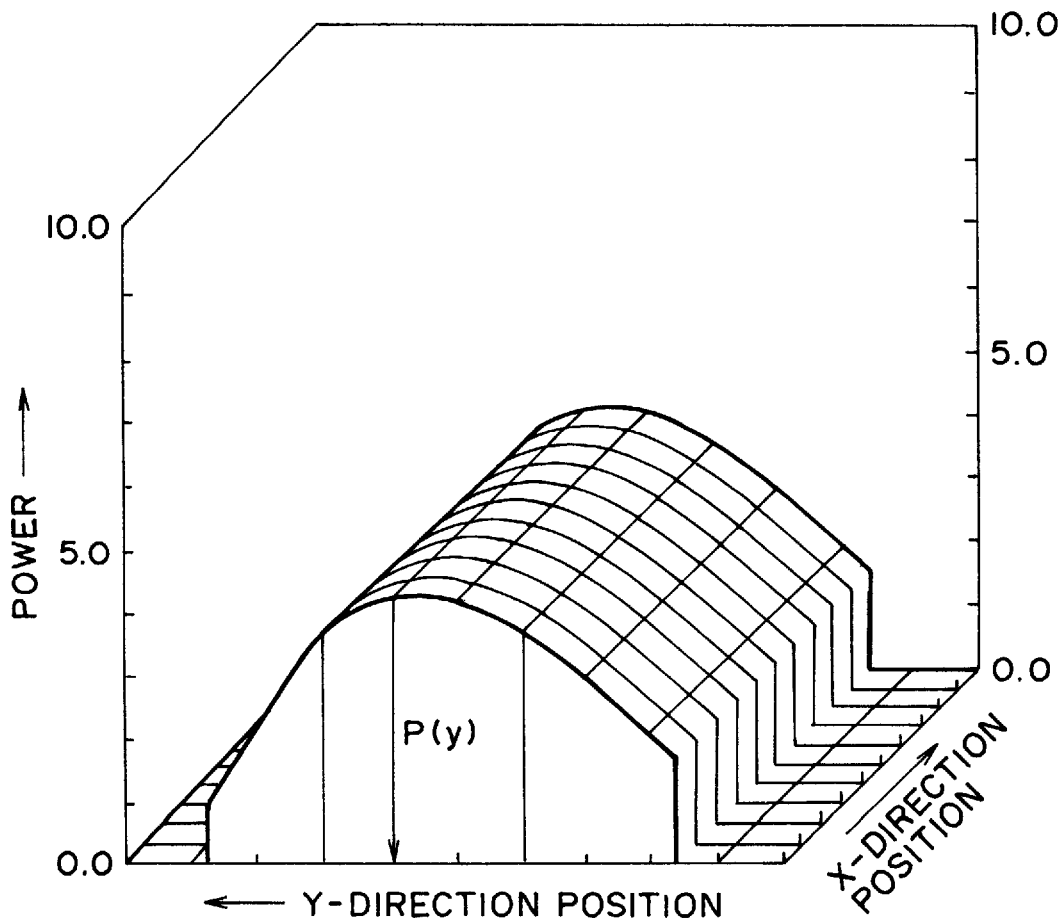
FIG. 32 is a schematic view for explaining an intensity profile of illumination light upon an exposure region.

FIG. 30 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the water after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:

an oscillation mirror for reflecting a radiation beam from a radiation source, the radiation beam comprising X-rays;

a driving mechanism for oscillating said oscillation mirror;

a detector for detecting a positional displacement of an incident radiation beam projected on said oscillation mirror and for producing an output;

a reference table for placing said driving mechanism and said detector with respect to the same reference such that no relative displacement occurs between said driving mechanism and said detector; and adjusting means for adjusting a position of said reference table with respect to the incident radiation beam, on the basis of the output of said detector, such that the position of said reference table follows any displacement occurring in the incident radiation beam.

2. An apparatus according to claim 1, wherein the radiation source comprises a syncyhrontron radiation source.

3. An apparatus according to claim 1, wherein said oscillation mirror has a predetermined curvature, and said apparatus further comprises a shutter for controlling an exposure amount of a substrate with the radiation beam reflected by said mirror.

4. An apparatus according to claim 3, further comprising control means for controlling movement of said mirror and movement of said shutter in a timed relation.

5. An apparatus according to claim 4, wherein said control means controls said driving mechanism so that, for one exposure, said mirror is moved only once by a predetermined amount.

6. An exposure apparatus, comprising:

an oscillation mirror for reflecting a radiation beam from a radiation source, the radiation beam comprising X-rays;

a driving mechanism for oscillating said oscillation mirror;

a detector for detecting a positional displacement of an incident radiation beam projected on said oscillation mirror and for producing an output; and adjusting means for adjusting an average position of said oscillation mirror with respect to the incident radiation beam, on the basis of the output of said detector, such that the average position of said oscillation mirror follows any displacement occurring in the incident radiation beam.

7. An apparatus according to claim 6, wherein the radiation source comprises a synchrotron radiation source.

8. An apparatus according to claim 6, wherein said oscillation mirror has a predetermined curvature, and said apparatus further comprises a shutter for controlling an exposure amount of a substrate with the radiation beam reflected by said mirror.

9. An apparatus according to claim 8, further comprising control means for controlling movement of said mirror and movement of said shutter in a timed relation.

10. An apparatus according to claim 9, wherein said control means controls said driving mechanism so that, for one exposure, said mirror is moved only once by a predetermined amount.

11. An exposure method for the manufacture of microdevices, said method comprising the steps of:

reflecting, by an oscillation mirror, a radiation beam from a radiation source, the radiation beam containing X-rays;

oscillating the oscillation mirror by a driving mechanism;

detecting, by a detector, a positional displacement of an incident radiation beam projected on the oscillation mirror;

placing the driving mechanism and the detector with respect to the same reference of a reference table such that no relative displacement occurs between the driving mechanism and the detector; and adjusting a position of the reference table with respect to the incident radiation beam, on the basis of an output of the detector, such that the position of the reference table follows any displacement occurring in the incident radiation beam.

12. An exposure method for the manufacture of microdevices, said method comprising the steps of:

reflecting, by an oscillation mirror, a radiation beam from a radiation source, the radiation beam containing X-rays;

oscillating the oscillation mirror by a driving mechanism;

detecting, by a detector, a positional displacement of an incident radiation beam projected on the oscillation mirror, the detector producing an output; and adjusting an average position of the oscillation mirror with respect to the incident radiation beam, on the basis of the output of the detector, such that the average position of the oscillation mirror follows any displacement occurring in the incident radiation beam.

* * * * *

UNITED STATES PATENT AND TRADEMARK OFFICE
CERTIFICATE OF CORRECTION

PATENT NO. : 5,835,560
DATED : November 10, 1998
INVENTOR(S) : MITSUAKI AMEMIYA, ET AL.

Page 1 of 2

It is certified that error appears in the above-identified patent and that said Letters Patent is hereby corrected as shown below:

COLUMN 2:

line 38, "Precisely" should read --precisely--.

COLUMN 4:

line 23, "lights" should read --light.--.

COLUMN 5:

line 8, "it" should read --if--;
    line 36, "$Y'_2$," should read --$y'_2$,--; and
    line 50, "$P(y',y_3) < P(y', y_3+\Delta y)$" should read --$P(y',y_3) < P(y', y_3+\Delta y)$.--.

COLUMN 7:

line 51, "water" should read --wafer--.

COLUMN 9:

line 45, "older" should read --order--.

COLUMN 11:

line 45, "curvature" should read --curvature.--.

UNITED STATES PATENT AND TRADEMARK OFFICE
CERTIFICATE OF CORRECTION

PATENT NO. : 5,835,560
DATED : November 10, 1998
INVENTOR(S) : MITSUAKI AMEMIYA, ET AL.

It is certified that error appears in the above-identified patent and that said Letters Patent is hereby corrected as shown below:

COLUMN 14:

line 52, "y=-15 mm" should read --y = 15 mm--.

COLUMN 15:

line 12, "May" should read --may--; and
line 63, "representative" should read --representative of--.

COLUMN 17:

line 49, "syncyhrontron" should read --synchrotron--.

Signed and Sealed this

Thirteenth Day of July, 1999

Attest:

Attesting Officer

Q. TODD DICKINSON

Acting Commissioner of Patents and Trademarks